(12) United States Patent
Fujiwara et al.

(10) Patent No.: US 6,803,271 B2
(45) Date of Patent: Oct. 12, 2004

(54) METHOD FOR MANUFACTURING SEMICONDUCTOR INTEGRATED CIRCUIT DEVICE

(75) Inventors: Tsuyoshi Fujiwara, Hamura (JP); Katsuyuki Asaka, Ome (JP); Yasuhiro Nariyoshi, Kodaira (JP); Yoshinori Hoshino, Tamaura (JP); Kazutoshi Oomori, Ome (JP)

(73) Assignees: Renesas Technology Corp., Tokyo (JP); Hitachi Tohbu Semiconductor, Ltd., Gunma (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/187,003

(22) Filed: Jul. 2, 2002

(65) Prior Publication Data

US 2003/0032233 A1 Feb. 13, 2003

(30) Foreign Application Priority Data

Aug. 9, 2001 (JP) ........................................ 2001-241793

(51) Int. Cl.[7] .......................................... H01L 21/8242
(52) U.S. Cl. ....................... 438/239; 438/243; 438/622; 438/787
(58) Field of Search ................................ 438/238, 240, 438/243, 250, 386, 393, 396, 622, 778, 787

(56) References Cited

U.S. PATENT DOCUMENTS

| | | | | |
|---|---|---|---|---|
| 5,858,837 A | * | 1/1999 | Sakoh et al. ................. | 438/255 |
| 6,037,278 A | | 3/2000 | Koyanagi et al. | |
| 6,150,209 A | * | 11/2000 | Sun et al. .................... | 438/240 |
| 6,165,834 A | * | 12/2000 | Agarwal et al. ............ | 438/240 |
| 6,215,144 B1 | * | 4/2001 | Saito et al. ................. | 257/310 |
| 6,414,348 B1 | * | 7/2002 | Cho et al. .................... | 257/306 |
| 6,485,988 B2 | * | 11/2002 | Ma et al. ........................ | 438/3 |

FOREIGN PATENT DOCUMENTS

| | | |
|---|---|---|
| JP | 9-289247 | 11/1997 |
| JP | 10-74835 | 3/1998 |
| JP | 10-173049 A | 6/1998 |
| JP | 11-243180 A | 9/1999 |

OTHER PUBLICATIONS

Wolf, S., Silicon Processing for the VLSI Era, vol. 2, Lattice Press, 1990, pp. 238–239.*

* cited by examiner

*Primary Examiner*—T. N. Quach
(74) *Attorney, Agent, or Firm*—Antonelli, Terry, Stout & Kraus, LLP

(57) ABSTRACT

It is desirable to prevent breakage and separation of wiring of a semiconductor integrated circuit device, such as a bit-line of a DRAM. To accomplish this, an HDP silicone oxide film is deposited on a bit-line that is connected to the source and drain region of a memory cell selection MISFET of a DRAM memory cell by means of a high density plasma CVD technique, and the structure is subjected to RTA (heat treatment) at 750° C. The surface is polished, and then a capacitor to be connected to the other of the source and drain region of the memory cell selection MISFET is formed. As a result, even when a tantalum oxide film, that serves as a capacitance insulating film of the capacitor, is subjected to heat treatment, the film stress exerted on the bit-line is reduced, and breakage and separation of the bit-line are prevented.

17 Claims, 20 Drawing Sheets

METHOD FOR MANUFACTURING SEMICONDUCTOR INTEGRATED CIRCUIT DEVICE

BACKGROUND OF THE INVENTION

This invention relates to a technique for manufacturing a semiconductor integrated circuit device; and, more particularly, the invention relates to a technique that may be effectively used to form an insulating film on a metal wiring.

Recently, a technique for making a laminated structure, formed of an element and wiring, has been developed concomitantly with high integration of an LSI. Though elements in such a structure are separated by an interlayer insulating film which is disposed therebetween, the problem of separation or breakage of the wiring due to the film stress of the conductive layer or interlayer insulating film, which constitutes an element or wiring of the laminate, has been revealed as the lamination has been developed.

More particularly, in the case where the process involves high temperature heat treatment after the interlayer insulating film is formed on the top of wiring, it has been found that such heat treatment causes an increased film stress and results in the problem of wiring separation or breakage.

For example, Japanese Published Unexamined Patent Application No. Hei 10(1998)-173049 discloses a technique in which a BPSG (Boro-Phosphate-silicate glass) film 83 is coated on the surface of a bit-line wiring layer by means of a CVD (Chemical Vapor Deposition) technique. Furthermore, this published patent application discloses a technique which involves the use of a HDP-SiO (High Density Plasma Silicon Oxide) film instead of a BPSG film, which allows the high temperature treatment in the forming process to be eliminated, whereby the thermal stress can be suppressed extremely.

Furthermore, Japanese Published Unexamined Patent Application No. Hei 11(1999)-243180 discloses a technique in which a third interlayer insulating film, that serves to insulate between a bit-line 27 and a bottom electrode of a capacitor, is formed as a silicon oxide film by use of a plasma CVD technique, wherein a special film forming condition is employed.

SUMMARY OF THE INVENTION

The inventors of the present invention have developed various techniques to improve the performance of a semiconductor integrated circuit device, including techniques to solve the above-mentioned problem of wiring separation and breakage.

For example, a memory cell of a DRAM (Dynamic Random Access Memory) comprises a memory cell selection MISFET (Metal Insulator Semiconductor Field Effect Transistor) and a capacitor (information storing capacitor element) that is connected in series to the memory cell selection MISFET, and a terminal thereof that is not connected to the capacitor is connected to a bit-line.

In the case of a so-called COB (capacitor over bit-line) structure, among the various known DRAM structures, a capacitor is formed on the top of a bit-line and an interlayer insulating film is formed between the bit-line and the capacitor, as will be described hereinafter. As described hereinafter, the capacitor forming process includes a high temperature heat treatment step, so that breaking and separation of a bit-line can be caused due to the difference in film stress between the bit-line and the interlayer insulating film.

It is an object of the present invention to relax the film stress of the wiring and an insulating film formed on the top thereof, that form structural components of a semiconductor integrated circuit device, and to prevent the breakage or separation of the wiring.

Furthermore, another object of the present invention is to improve the performance of a semiconductor integrated circuit device.

The above-mentioned objects, other objects, and novel features of the present invention will be apparent from the following description of the present invention and the attached drawings.

An outline of representative aspects and features of the present invention, as disclosed in the present application, will be described briefly hereinafter.

(1) A method of manufacture of a semiconductor integrated circuit device in accordance with the present invention involves a successive process in which a second insulating film is formed at a first temperature so as to cover wiring, the second insulating film is subjected to heat treatment at a second temperature that is higher than the first temperature, and then a first electrode, a dielectric film and a second electrode are formed on the second insulating film.

(2) A method of manufacture of a semiconductor integrated circuit device in accordance with the present invention comprises the steps of forming a second insulating film so as to cover wiring by means of a chemical vapor deposition technique, forming a third insulating film, which is a coated film, on the second insulating film, and, after heat-treating at a first temperature, forming a fourth insulating film on the third insulating film by means of a chemical vapor deposition technique, and further forming a first electrode, a dielectric film and a second electrode on the fourth insulating film, wherein the step of forming the dielectric film includes a step of heat-treating the dielectric film at a second temperature, wherein the first temperature is equal to or higher than the second temperature.

(3) A method of manufacture of a semiconductor integrated circuit device in accordance with the present invention comprises the steps of forming a second insulating film so as to cover wiring, heat-treating the second insulating film at a first temperature, thereafter etching the second insulating film so that the surface of the wiring is exposed to form an aperture on the second insulating film, forming a first conductive layer inside the aperture at a second temperature by means of a chemical vapor deposition technique, forming a second conductive layer on the first conductive layer, and polishing the first and second conductive layers so that the first and second conductive layers remain selectively inside the aperture, wherein the first temperature is equal to or higher than the second temperature.

DETAILED DESCRIPTION OF THE PREFERRED EMBODIMENTS

Various embodiments of the present invention will be described in detail hereinafter with reference to the drawings. In all the drawings of the various embodiments, components having the same function are given the same reference numbers and characters, respectively, and a repeated description thereof will be omitted.

Embodiment 1

A method of manufacture of a DRAM according to an embodiment of the present invention will be described with reference to FIG. 1 to FIG. 11, in the order of the steps thereof.

Figure 1:
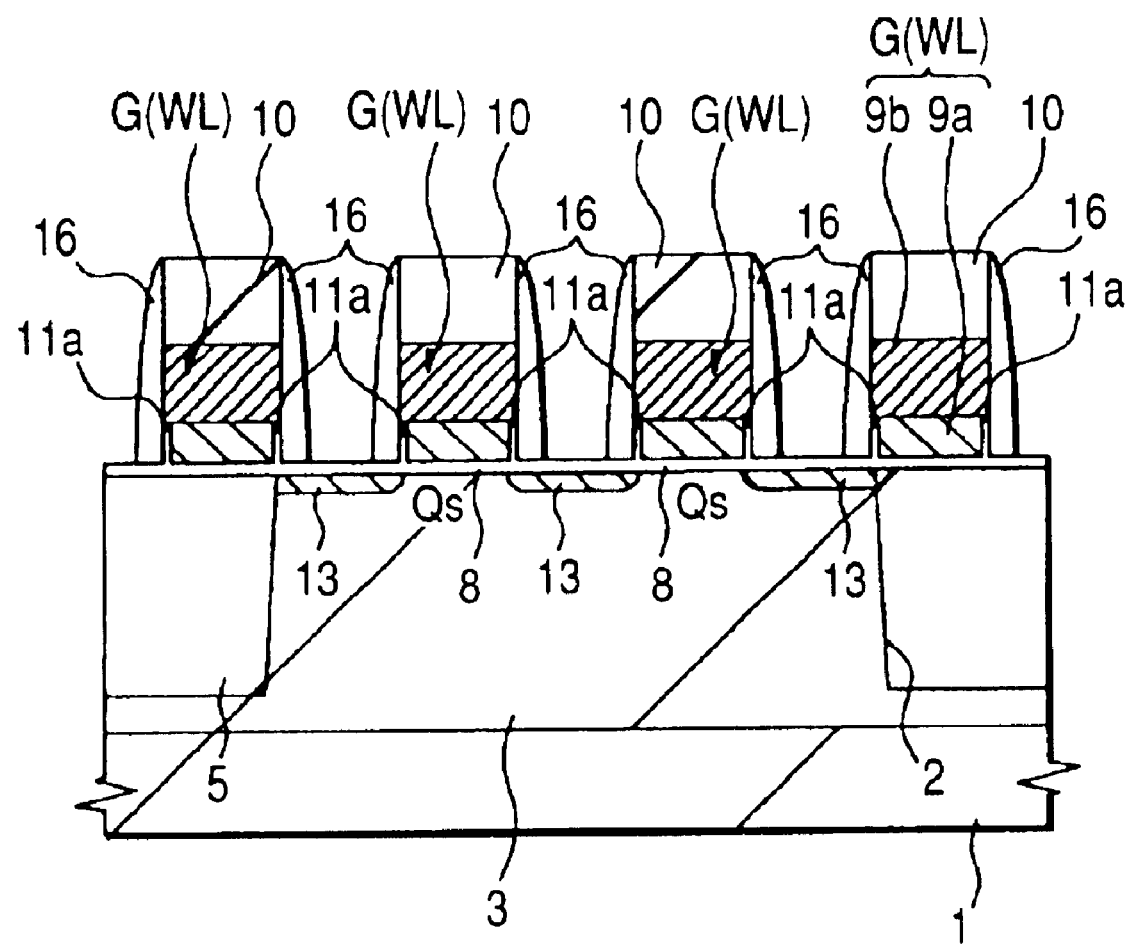
FIG. 1 is a partial cross-sectional view, as seen along line A—A in FIG. 2, of a substrate showing a step in the method of manufacture of a semiconductor integrated circuit device (DRAM) according to the embodiment 1 of the present invention.
Figure 2:
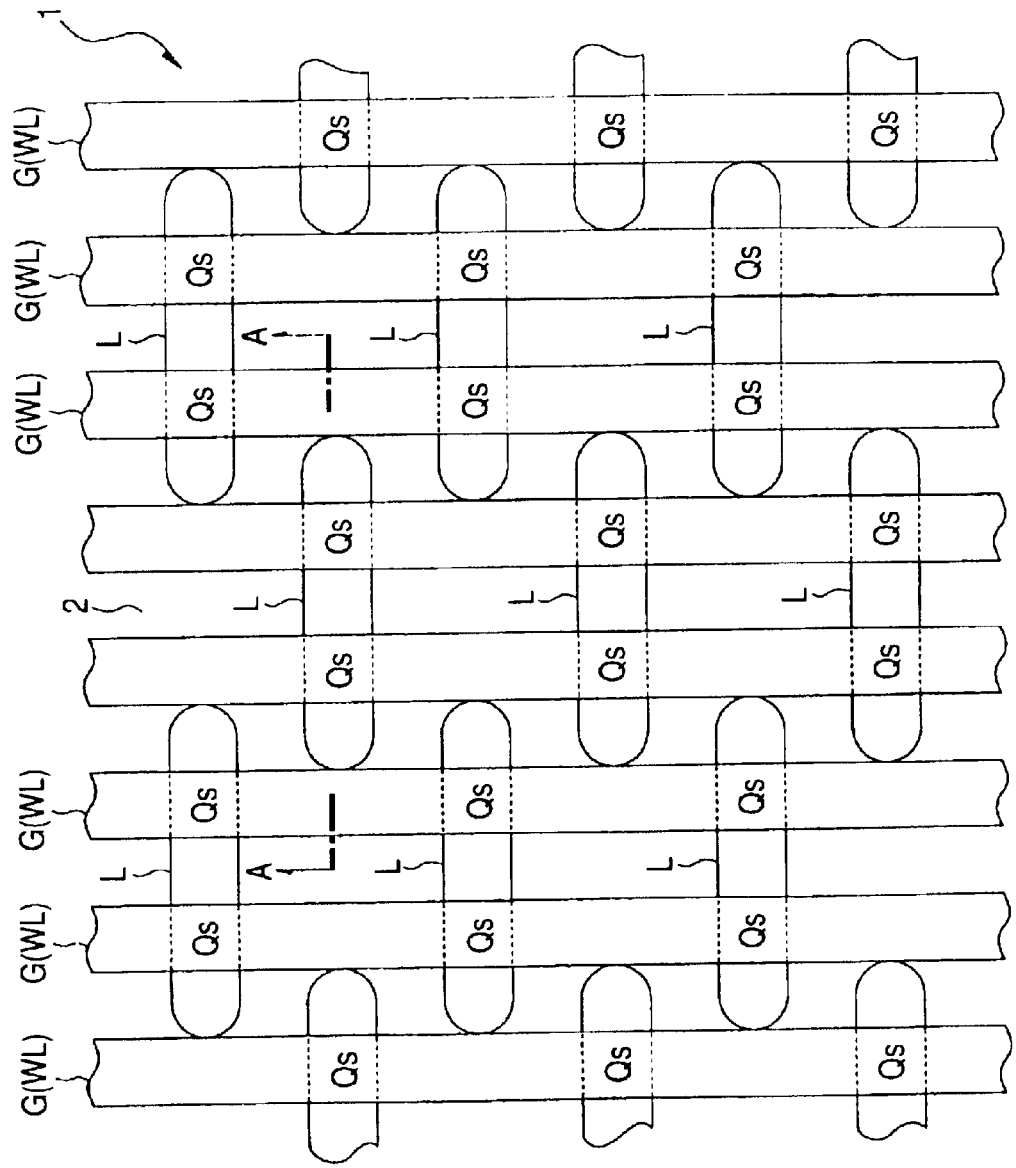
FIG. 2 is a partial plan view of the substrate showing a step in the method of manufacture of the semiconductor integrated circuit device (DRAM) according to the embodiment 1 of the present invention.

At first, as shown in FIG. 1 and FIG. 2, a memory cell selection MISFET Qs is formed on the main surface of a semiconductor substrate 1 (p-type well 3 and active region L). One exemplary process for forming a memory cell selection MISFET Qs will be described hereinafter. FIG. 1 is a partial cross-sectional view of a semiconductor substrate showing a step in the process of manufacture of a DRAM according to the present embodiment, and FIG. 2 is a partial plan view of the semiconductor substrate. FIG. 1 corresponds, for example, to the cross-section taken along the line A—A in FIG. 2.

As shown in FIG. 2, an active region (L) is defined by an element separation 2, and the element separation 2 is formed as will be described hereinafter.

At first, the surface of the semiconductor substrate 1 is etched to form a groove, and a thin silicon oxide film (not shown in the drawing) is formed on the inside of the groove. Subsequently, a silicon oxide film 5 is deposited on the semiconductor substrate 1, including the inside of the groove, by means of a Chemical Vapor Deposition (CVD) technique, and the silicon oxide film 5 is polished by means of a Chemical Mechanical Polishing (CMP) technique. Next, a p-type well 3 is formed by ion-implantation of B (Boron) into the semiconductor substrate 1. As a result, a narrow long active region (L) surrounded by the element separation 2 is formed, as shown in FIG. 2. Two memory cell selection MISFETs Qs, that use any one of a source and drain in common, are formed on each active region (L).

Subsequently, a memory cell selection MISFET $Q_s$ is formed. To form a memory cell selection MISFET Qs, at first, the surface of the p-type well 3 is cleaned with a HF (hydrofluoric acid)-base cleaning solution, and then, a gate insulating film 8 is formed on the surface of the p-type well 3 (active region L) by means of thermal oxidation of the semiconductor substrate 1.

Next, gate electrodes (conductive member) G are formed on the top of the gate insulating film 8. To form the gate electrodes G, at first, an n-type polycrystalline silicon film 9a, that has been doped with P (phosphorous), a WN (tungsten nitride, not shown in the drawing) film, a W (tungsten) film 9b and a silicon nitride film 10 are deposited successively in this order on the top of the gate insulating film 8. Thereafter, a silicon nitride film 10 is dry-etched using a photoresist film (not shown in the drawing) as a mask. At that time, the silicon nitride film 10 remains on the region where a gate electrode is to be formed.

Next, the W film 9b, the WN film (not shown in the drawing), and the polycrystalline silicon film 9a are subjected to dry etching using the silicon nitride film 10 as a mask to form the gate electrodes G, each comprising the polycrystalline silicon film 9a, the WN film and the W film 9b. Herein, each gate electrode G functions as a word line WL.

Next, a so-called Wet Hydrogen oxidation is carried out in an atmosphere of $H_2O$ and $H_2$ to form a thin oxide film (light oxide film) 11a on the side wall of the polycrystalline silicon film 9a. This oxide film is formed in order to improve the dielectric strength between the gate electrode and the source and drain regions. In this case, the silicon (polycrystalline silicon, silicon substrate) is selectively oxidized by means of Wet Hydrogen oxidation without oxidation of the W film 9b. Therefore, abnormal oxidation of the W film 9b can be prevented.

Next, an n-type impurity (phosphorous) is injected to the p-type wells 3 located on both sides of each gate electrode G so as to form n-type semiconductor regions 13.

Next, a silicon nitride film is deposited on the semiconductor substrate 1 by means of a CVD technique, and the deposit is etched anisotropically to form a side wall film 16 on the side walls of each gate electrode G.

Figure 3:
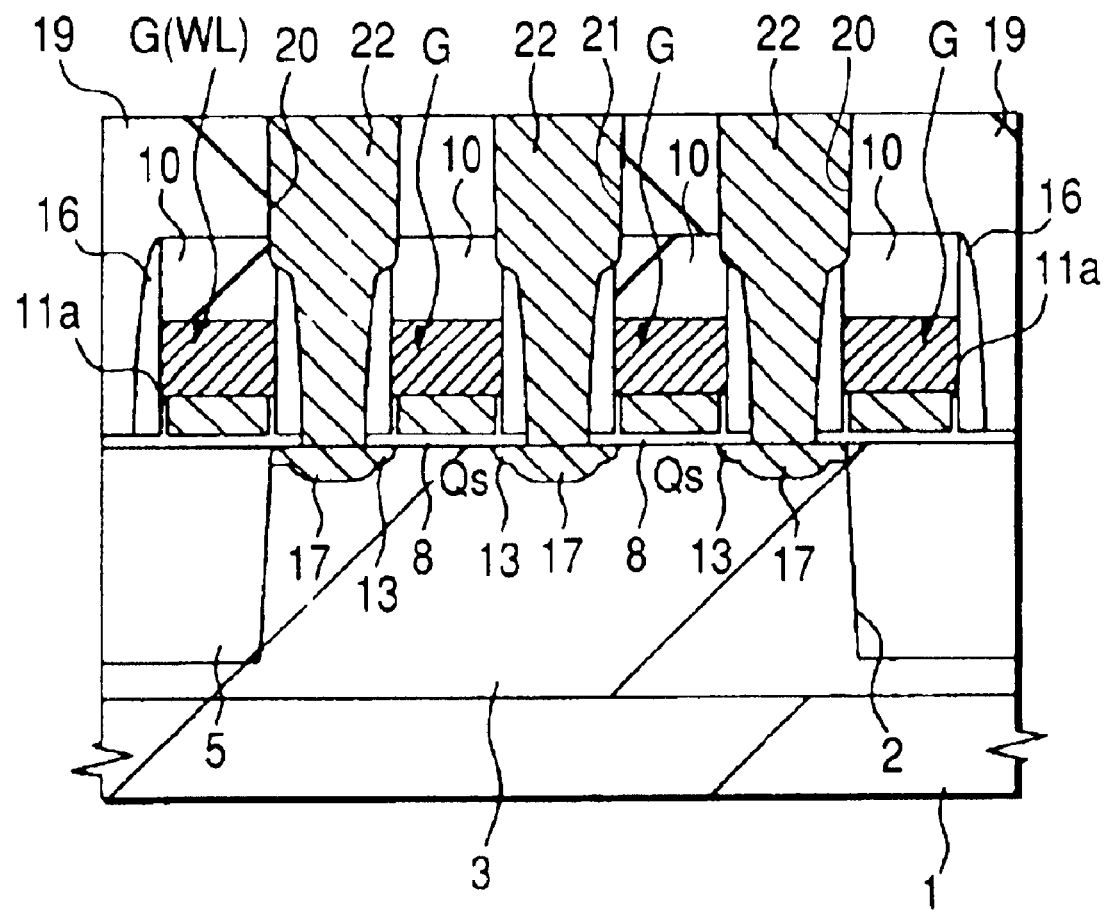
FIG. 3 is a partial cross-sectional view, as seen along line A—A in FIG. 4, of the substrate showing a step in the method of manufacture of the semiconductor integrated circuit device (DRAM) according to the embodiment 1 of the present invention.
Figure 4:
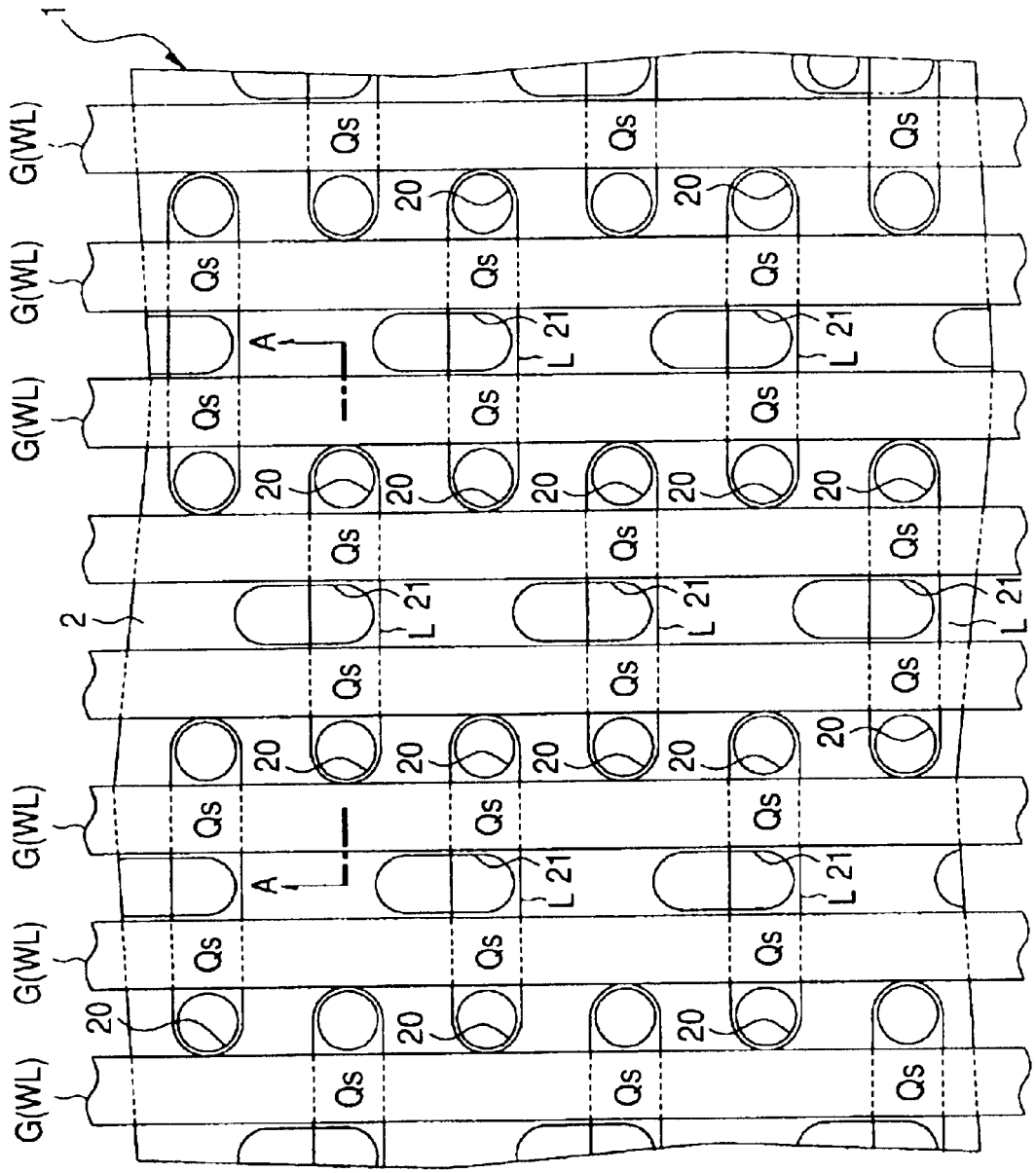
FIG. 4 is a partial plan view of the substrate showing a step in the method of manufacture of the semiconductor integrated circuit device (DRAM) according to the embodiment 1 of the present invention.

Next, as shown in FIG. 3 and FIG. 4, a silicon oxide film 19 is formed on the top of the semiconductor substrate 1 by means of a CVD technique, and the top of the silicon oxide film 19 is polished by means of a CMP technique to flatten the surface. FIG. 3 is a partial cross-sectional view of the semiconductor substrate showing a step in the process of manufacture of a DRAM of the present embodiment, and FIG. 4 is a partial plan view of the semiconductor substrate. FIG. 3 corresponds, for example, to the cross-section taken along the line A—A of FIG. 4.

Next, contact holes 20 and 21 are formed on the top of the n⁻-type semiconductor region 13; the surface of the semiconductor substrate 1 (n⁻-type semiconductor region 13) is exposed; and, an n-type impurity (phosphorous) is ion-implanted into the p-type well 3 (n⁻-type semiconductor region 13) of the memory cell array section through the contact holes 20 and 21, to thereby form a n⁺-type semiconductor region 17.

Through the process described above, the memory cell selection MISFET Qs, that constitutes the DRAM memory cell, is completed.

Subsequently, a bit-line BL and capacitor (information storing capacitance element) C, to be connected electrically to the n⁺-type semiconductor region 17 of the memory cell selection MISFET Qs, are formed. Because the DRAM of the present embodiment has the above-mentioned COB structure, the capacitor C is formed after the bit-line BL has been formed. The process for forming the bit-line BL and the capacitor C will be described in detail hereinafter.

Figure 8:
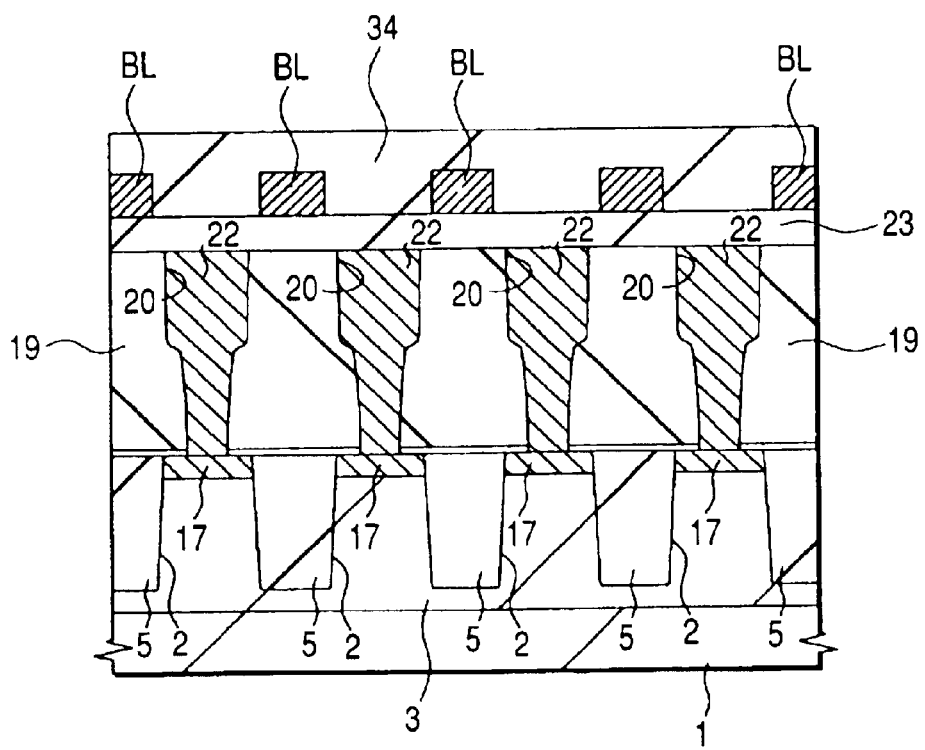
FIG. 8 is a partial cross-sectional view, as seen along the line B—B in FIG. 6, of the substrate showing a subsequent step in the method of manufacture of the semiconductor integrated circuit device (DRAM) according to the embodiment 1 of the present invention.
Figure 9:
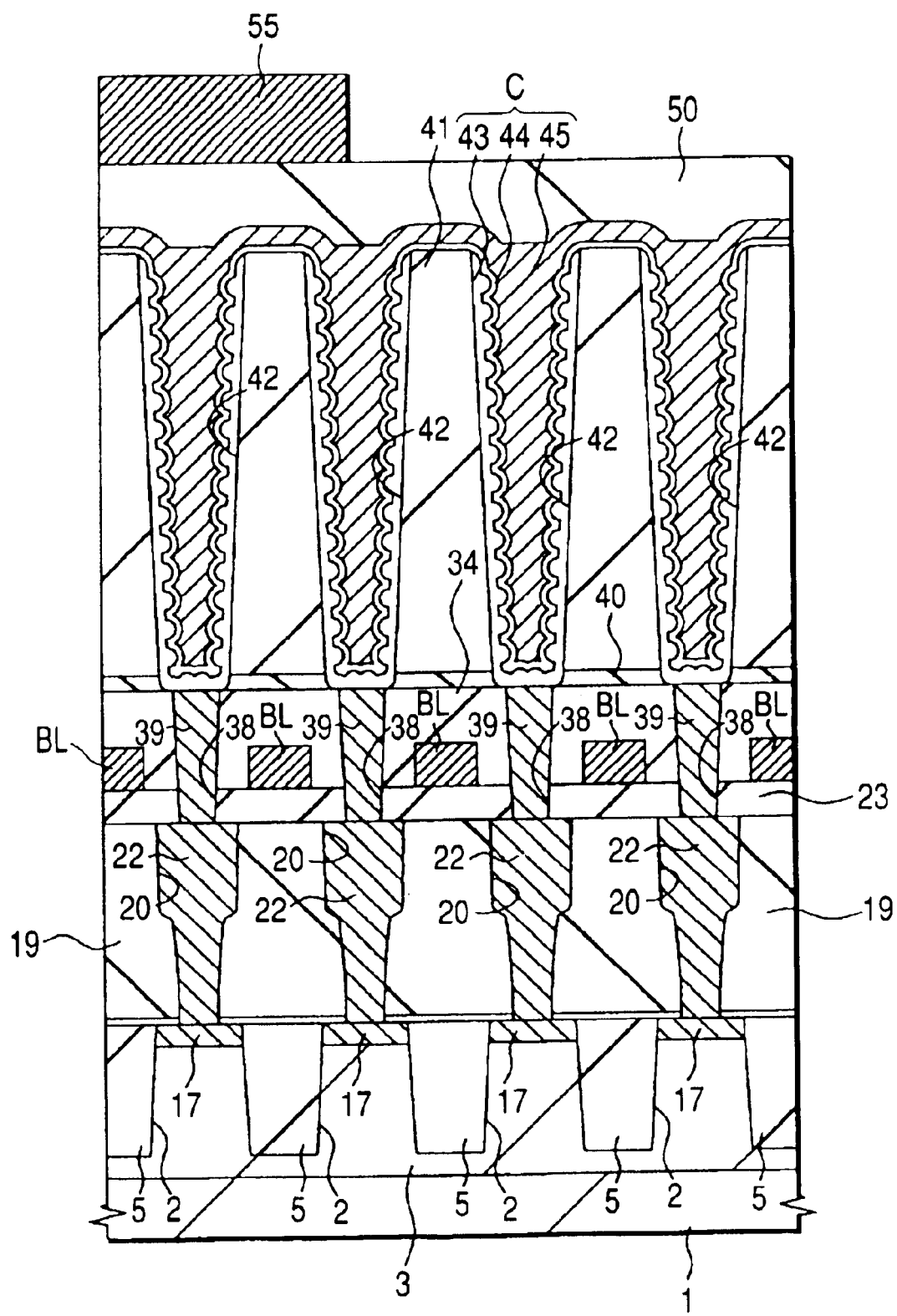
FIG. 9 is a partial cross-sectional view, as seen along the line A—A in FIG. 11, of the substrate showing a step in the method of manufacture of the semiconductor integrated circuit device (DRAM) according to the embodiment 1 of the present invention.

The bit-line BL and capacitor C are connected through the n⁺-type semiconductor region 17 of the memory cell selection MISFET Qs and a plug 22 (refer to FIG. 8 and FIG. 9).

Figure 5:
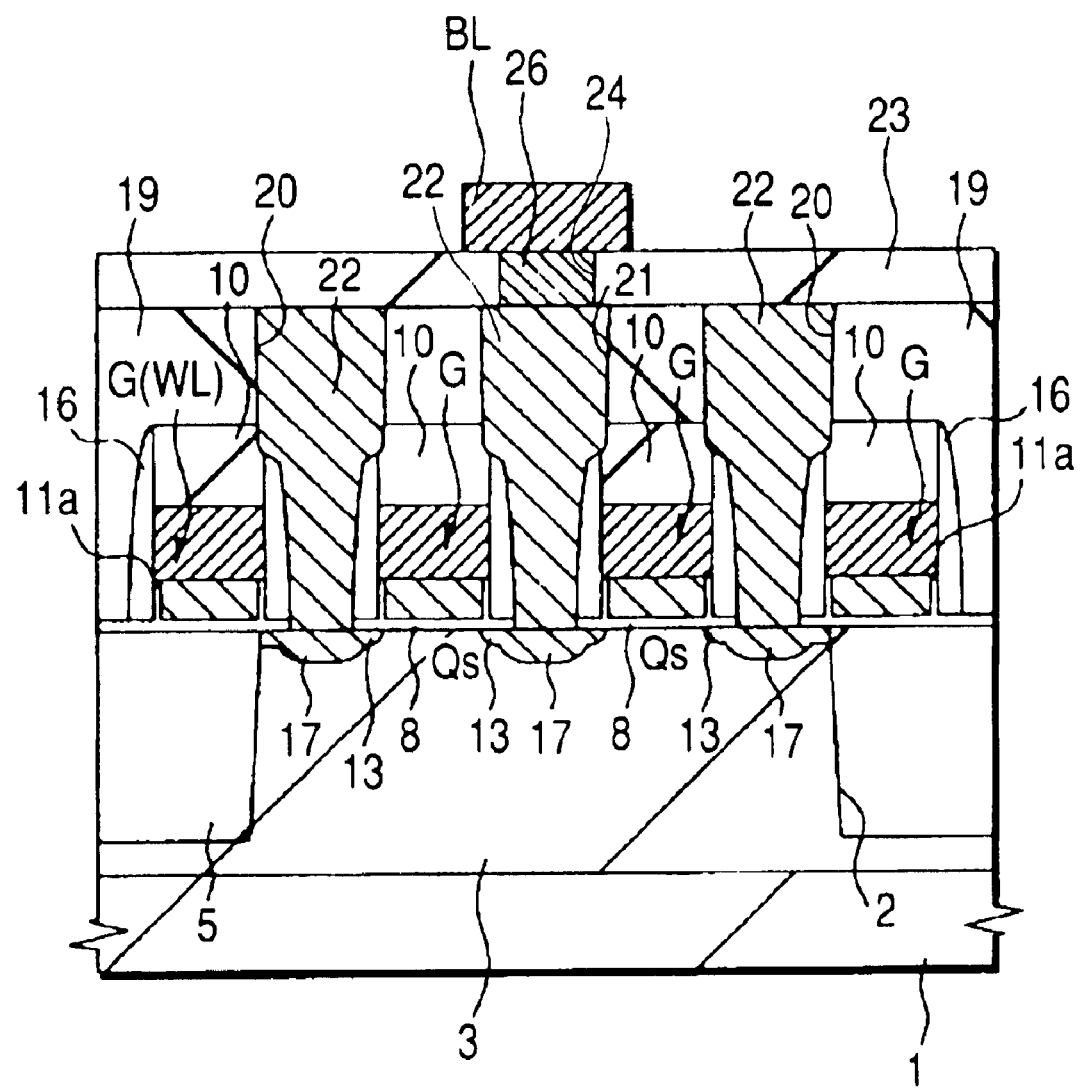
FIG. 5 is a partial cross-sectional view, as seen along line A—A in FIG. 6, of the substrate showing a step in the method of manufacture of the semiconductor integrated circuit device (DRAM) according to the embodiment 1 of the present invention.
Figure 6:
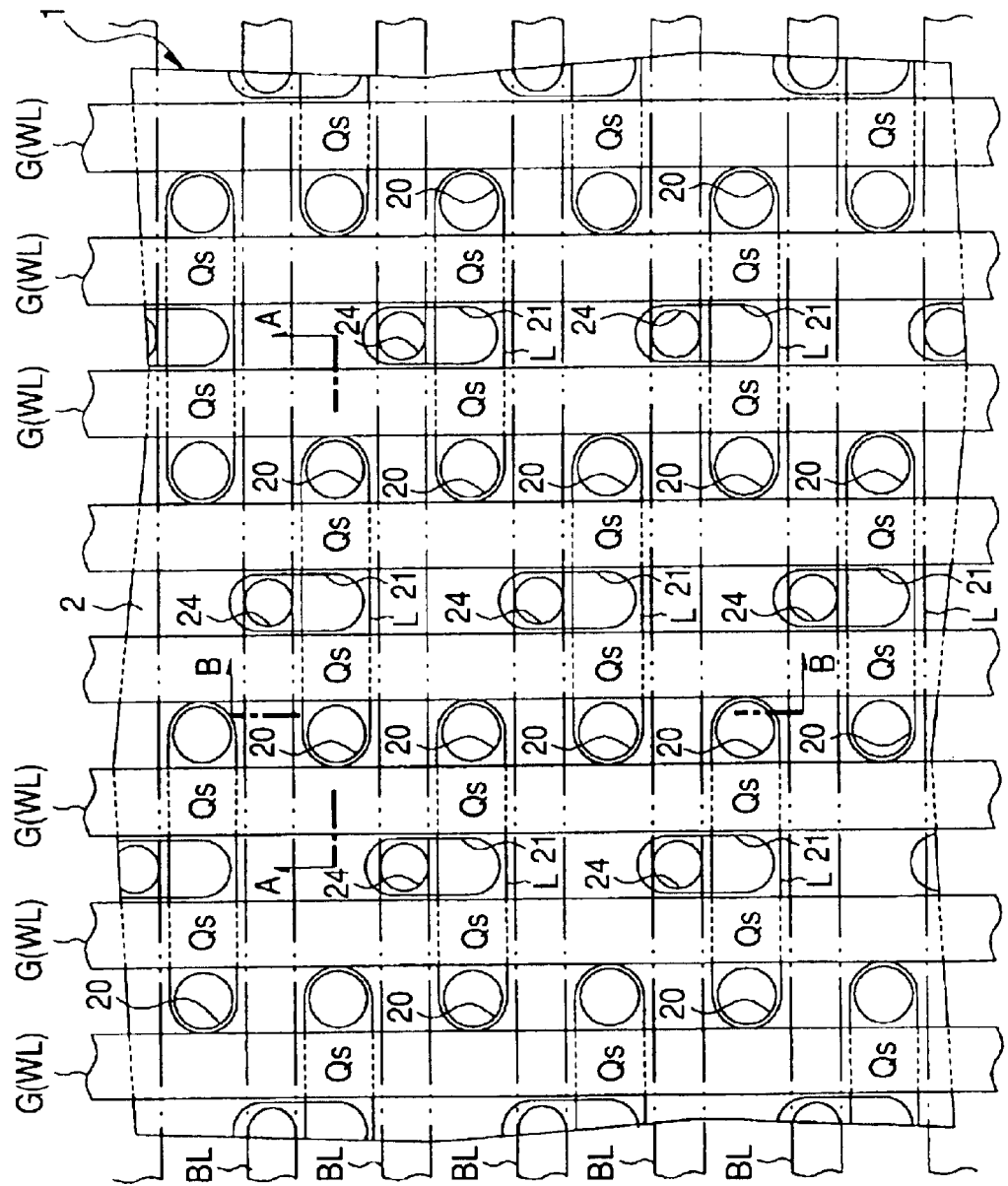
FIG. 6 is a partial plan view of the substrate showing a step in the method of manufacture of the semiconductor integrated circuit device (DRAM) according to the embodiment 1 of the present invention.

The plug 22 is formed inside the contact holes 20 and 21, as shown in FIG. 5 and FIG. 6. FIG. 5 is a partial cross-sectional view of the semiconductor substrate showing a step in the process of manufacture of the DRAM of the present embodiment, and FIG. 6 is a partial plan view of the semiconductor substrate. FIG. 5 corresponds, for example, to the cross-section taken along the line A—A of FIG. 6.

To form the plug 22, at first a low resistance polycrystalline silicon film doped with an n-type impurity, such as phosphorous (P), is deposited on the top of the silicon oxide film 19, including the inside of the contact holes 20 and 21, by means of a CVD technique, and the polycrystalline silicon film is polished so as to remain only inside the contact holes 20 and 21, thereby to form the plug 22.

Next, a silicon oxide film 23 is deposited on the top of the silicon oxide film 19 by means of a CVD technique, and a through hole 24 is formed by means of a dry etching technique using a photoresist film (not shown in the drawing) as a mask on the top of the plug 22 that has been formed inside the contact hole 21.

Next, a W film is deposited on the top of the silicon oxide film 23, including the inside of the through hole 24, by means of a CVD technique, and the W film formed on the top of the silicon oxide film 23 is polished by means of a CMP technique so as to remain only inside the through hole 24, to thereby form a plug 26.

Next, a bit-line BL is formed on the top of the plug 26. The bit-line is formed, for example, by employing a method in which a W film is deposited on the top of the silicon oxide film 23, including the top of the plug 26, and the W film is subjected to dry etching using a photoresist film (not shown in the drawing) as a mask. Though the bit-line BL cannot be seen on the cross-section taken along the A—A line, a part of the plug 26 and the bit-line BL that are positioned above the cross section taken along the line A—A of FIG. 6 is shown in FIG. 5 (same as in FIG. 10), so as to show clearly the relation between the MISFET Qs (plug 22) and the bit-line BL.

Figure 7:
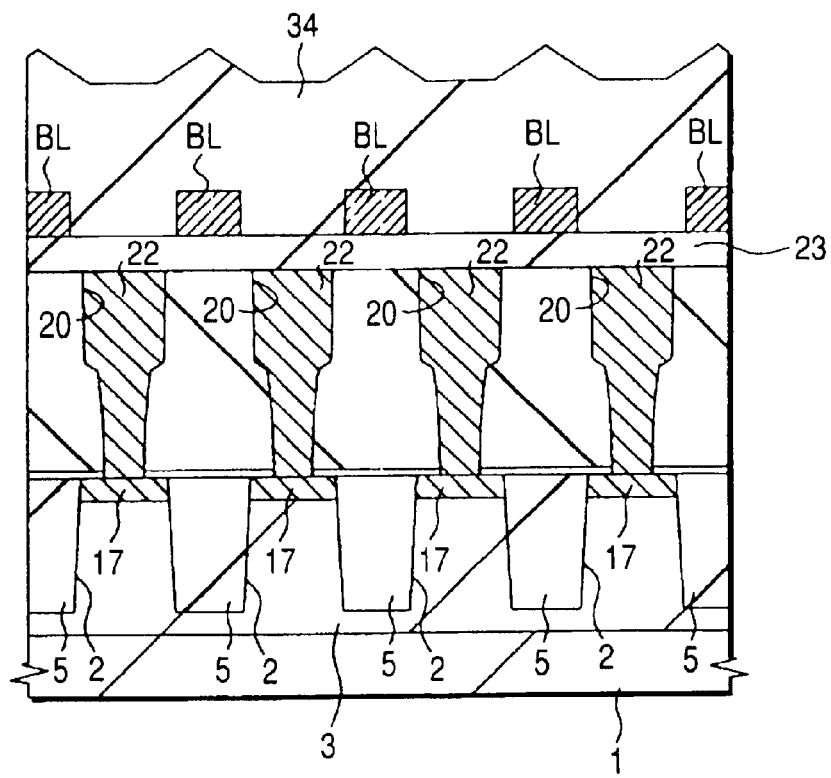
FIG. 7 is a partial cross-sectional view, as seen along the line B—B in FIG. 6, of the substrate showing a step in the method of manufacture of the semiconductor integrated circuit device (DRAM) according to the embodiment 1 of the present invention.

Next, as shown in FIG. 7, a silicon oxide film 34 is deposited on the top of the silicon oxide film (insulating film) 23, including the tops of the bit-lines BL. FIG. 7, for example, corresponds to the cross-section taken along the line B—B of FIG. 6 (as well as in FIG. 8). As shown in the drawing, the bit-lines are disposed with a constant interval.

The silicon oxide film 34 on the bit lines BL is formed by means of a high density plasma CVD (referred to as HDP-CVD hereinafter) technique. Such a silicon oxide film will be referred to as a HDP silicon oxide film hereinafter. The HDP-CVD technique involves a CVD process that is carried out in a low pressure and high electron density atmosphere. Regular plasma CVD is carried out in an atmosphere in which the pressure is in a range from 1 to 10 Torr and the electron density is in a range from $1 \times 10^9$ to $1 \times 10^{10}$. On the other hand, HDP-CVD is carried out in an atmosphere in which the pressure is in a range from 0.001 to 0.01 Torr and the electron density is $1 \times 10^{12}$ or higher. The film component is deposited (silicon oxide in this case), and, at that time, etching is carried out by means of high density plasma simultaneously. Therefore, silicon oxide is caused to penetrate deeply inside of a groove even though the groove is a narrow and small groove (narrow space). Herein, the film forming temperature in this case (first temperature) is 700° C. or lower, and, for example, the film forming temperature is 350 to 650° C. for the silicon oxide film 34.

Next, the semiconductor substrate 1 is subjected to RTA (Rapid Thermal Anneal, Lamp Anneal, heat treatment) for within 60 seconds at 750° C. (second temperature). The RTA involves heat treatment in which a light emitted from a lamp, such as a tungsten-halogen lamp, is irradiated onto the semiconductor substrate 1 (wafer) to heat it with radiation heat.

Next, the top of the HDP silicon oxide film 34 is polished by means of a CMP technique to flatten the surface. Heat treatment may be applied after the polishing. The HDP silicon oxide film 34 serves as an interlayer insulating film for providing insulation between the bit-line BL and a capacitor C, which will be described hereinafter.

As described hereinabove, according to the present embodiment, because heat treatment (RTA) is carried out after the HDP silicon oxide film 34 has been formed, the film stress caused by the HDP silicon oxide film 34 is reduced previously. As a result, the film stress exerted on the bit-line BL can be reduced even when high temperature treatment, for example, crystallization annealing of the capacitance insulating film (tantalum oxide film) of the capacitor C is carried out in the following process. Breakage and separation (pealing) of the bit-line BL can be reduced as a result. Though RTA is carried out at 750° C. in the present embodiment, a RTA temperature that is higher than the film forming temperature of the HOP silicon oxide film 34 is more effective. By employing an RTA temperature that is equal to or higher than the crystallization annealing temperature, the stress that is the same level as that exerted on the bit-line BL and HDP silicon oxide film 34 is relaxed in annealing.

Figure 12:
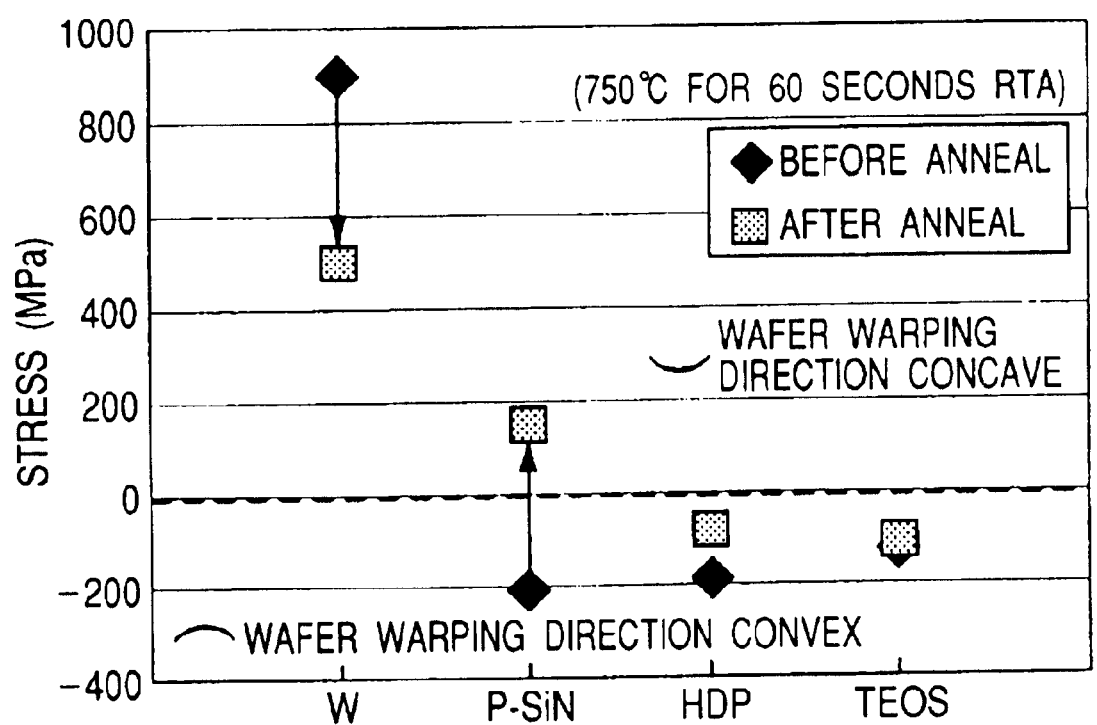
FIG. 12 is a diagram showing the effect of the embodiment of the present invention.

The film stress of the silicon oxide film and the W film of the bit-line BL will be described hereinafter. FIG. 12 is a diagram showing the film stress (MPa) changes that occur when RTA (heat treatment) is carried out for 60 seconds at 750° C. The abscissa in the drawing shows the type of film. W denotes Wm, P-SiN denotes a silicon nitride film formed by means of a plasma CVD technique, HDP denotes a HDP silicon oxide film, and TEOS denotes a silicon oxide film formed by means of a CVD technique from ozone ($O_3$) and tetraethoxy-silane, which are used as the raw materials (referred to as TEOS film hereinafter). The stress is exerted on the semiconductor substrate (wafer) so as to produce a concave deformation in the positive stress region, and so as to produce a convex deformation in the negative stress region.

As shown in the drawing, in the case of the W film, the film stress changes from approximately 900 MPa to approximately 500 MPa between the time before and the time after the RTA, and that means that the stress will change by approximately −400 MPa. Furthermore, in the case of the HDP silicon oxide film, the film stress changes from approximately −180 MPa to approximately −80 MPa, and that means that the film stress changes by approximately +100 MPa. In the case of the TEOS film, the film stress changes from approximately −120 MPa to approximately −105 MPa, and that means that the film stress changes by approximately +15 MPa.

On the other hand, in the case of a silicon nitride film that has been formed by means of a plasma CVD technique, the film stress changes from approximately −200 MPa to approximately 150 MPa, and that means that the film stress changes by approximately +350 MPa. As described hereinabove, in the case of the insulating film, such as the silicon oxide film and the silicon nitride film, the film stress changes in the positive direction due to the RTA. In other words, these films change so that the wafer is subjected to concave deformation, and, on the other hand, the metal film, such as the W film, changes so that the wafer is subjected to convex deformation due to the RTA.

Therefore, if these films are laminated and are subjected to RTA, the adhesion surface of the film tends to become separated due to the stress change of the various films, whereby a thin pattern, such as the wiring, is broken. More particularly, in the case where the width of the bit-line BL is made to be 0.12 μm or thinner, in an effort to form a highly integrated DRAM, breakage and separation occur easily. Furthermore, as described hereinabove, because the stress change direction is different between an insulating film and a metal film, breakage and separation occur even more easily.

For example, a silicon nitride film 40 is formed as an etching stopper when a groove in which the capacitor C is to be formed is formed, as will be described hereinafter in detail. Furthermore, a silicon oxide film 41 is deposited on the top of the silicon nitride film 40, and the capacitance insulating film (tantalum oxide film) of the capacitor C is subjected to crystallization annealing thereafter. If the stresses which occur in these films (bit-line BL, HDP silicon oxide film 34, silicon nitride film 40, and silicon oxide film 41) change differently from each other when the capacitor C is annealed, a strong stress is exerted on the bit-line BL in a short time, thereby to cause breakage or separation of the bit-line BL.

However, according to the present embodiment, because the bit-line BL, on which the HDP silicon oxide film 34 has been deposited, is subjected to RTA, the film stress due to the HDP silicon oxide film 34 is reduced beforehand.

Next, the temperature rising speed of the RTA will be described. FIG. 12 shows two temperature rising conditions of the RTA, and FIG. 14 shows plots of the yield obtained when the treatment is carried out under the temperature rising conditions shown in FIG. 13 for various bit-line BL widths (μm).

Figure 13:
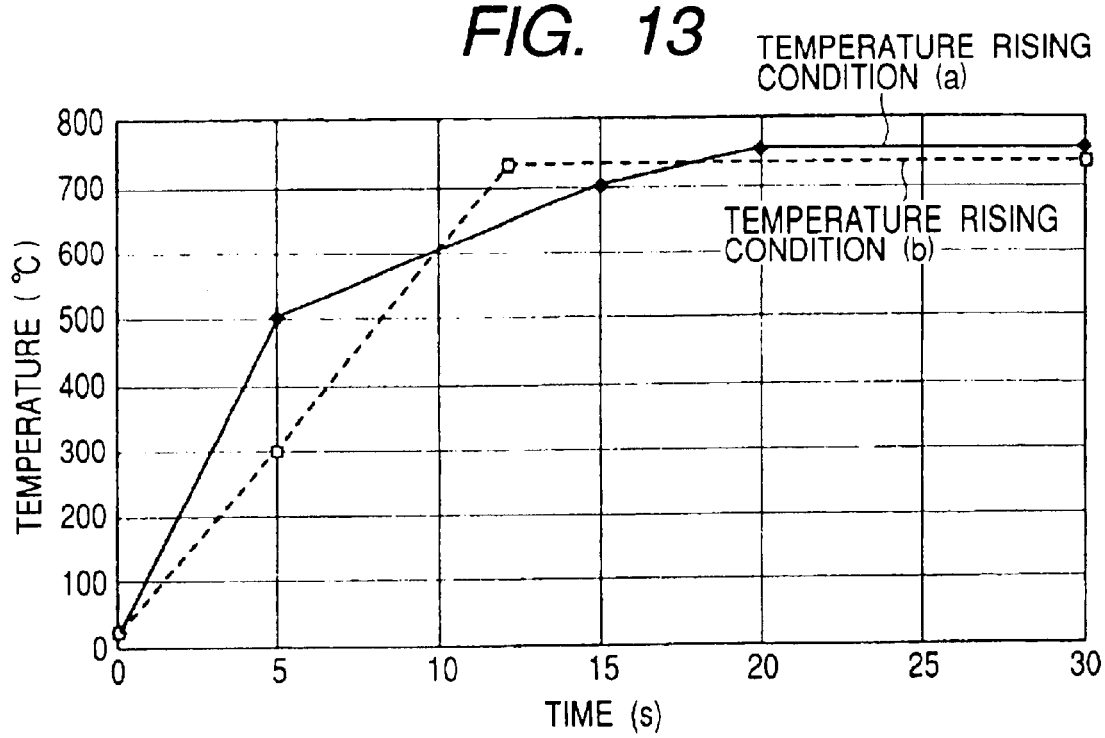
FIG. 13 is a graph showing the effect of the embodiment of the present invention.
Figure 14:
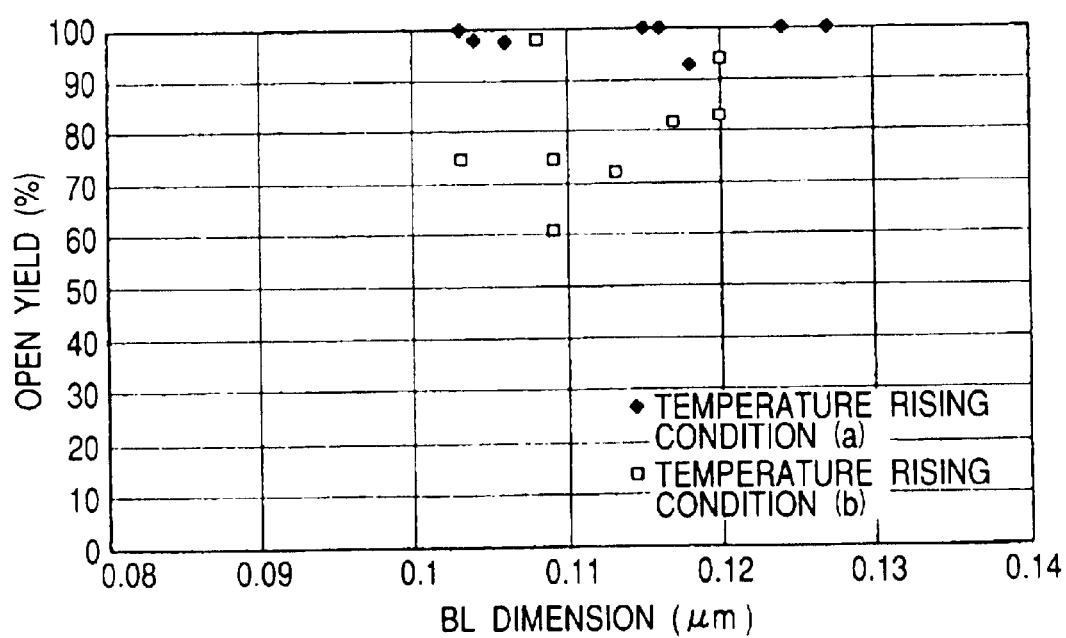
FIG. 14 is a diagram showing the effect of the embodiment of the present invention.

The solid line (a) in FIG. 13 shows the temperature rising condition in which the temperature rises at a speed of approximately 20° C./second from a temperature near 500° C., that is the film forming temperature of the HDP silicon oxide film 34. On the other hand, the broken line (b) shows the temperature rising condition in which the temperature rises at a speed of 60° C./second continuously from the beginning to a temperature higher than 500° C. for the treatment.

These temperature rising conditions were applied to DRAMs having various bit-line BL widths and the yield was measured. As a result, it was found that, in the case of the temperature rising condition (b) (square marks), a yield of 90% or more was obtained for the bit-line width of approximately 0.12 μm, but the yield decreases as the bit-line width decreases, and a yield of 75% was obtained for the bit-line width of 0.11 μm. On the other hand, it was found that, in the case of the temperature rising condition (a) (rhomboid marks), a yield of 90% or more is obtained over the whole bit-line width range from 0.13 μm to 0.1 μm, and, in some cases, a yield of nearly 100% was obtained.

As described hereinbefore, the slow temperature rising, for example, an RTA temperature rising speed of 60°

C./second or slower, allows the stress exerted on the bit-line to be relaxed, and so breakage and separation of the bit-line can be prevented. As a result, the yield can be improved. It is not necessary to slow down the temperature rising speed up to the film forming temperature of the silicon oxide film; therefore, the temperature rising speed may be slowed down after reaching the film forming temperature of the silicon oxide film. Furthermore, the RTA temperature rising speed can be controlled by controlling the lamp output.

Furthermore, in the present embodiment, because of provision of a structure in which a single layer (only the HDP silicon oxide film 34) is interposed between the bit-line BL and the capacitor C, which will be described hereinafter, and in which the top surface is flattened by means of a CMP technique, the occurrence of foreign matter is suppressed.

In more detail, as shown in the embodiment 4, though it is possible to flatten the surface by use of an SOG (Spin On Glass) film, in such a case, it is necessary to employ a structure in which the SOG film is interposed between dense TEOS films on the top and bottom in order to reinforce the strength of the interlayer insulating film and in order to avoid the effect of moisture generated from the SOG film. In this case, it is necessary to form the TEOS film, SOG film and TEOS film successively on the bit-line BL, and so, such process can result in foreign matter remaining between these films. Particularly, as described hereinafter, because the SOG film is a coated film and is formed using equipment different from the equipment for forming the TEOS film, foreign matter is likely to be carried on the film surface when the film is transferred between equipment.

Figure 15:
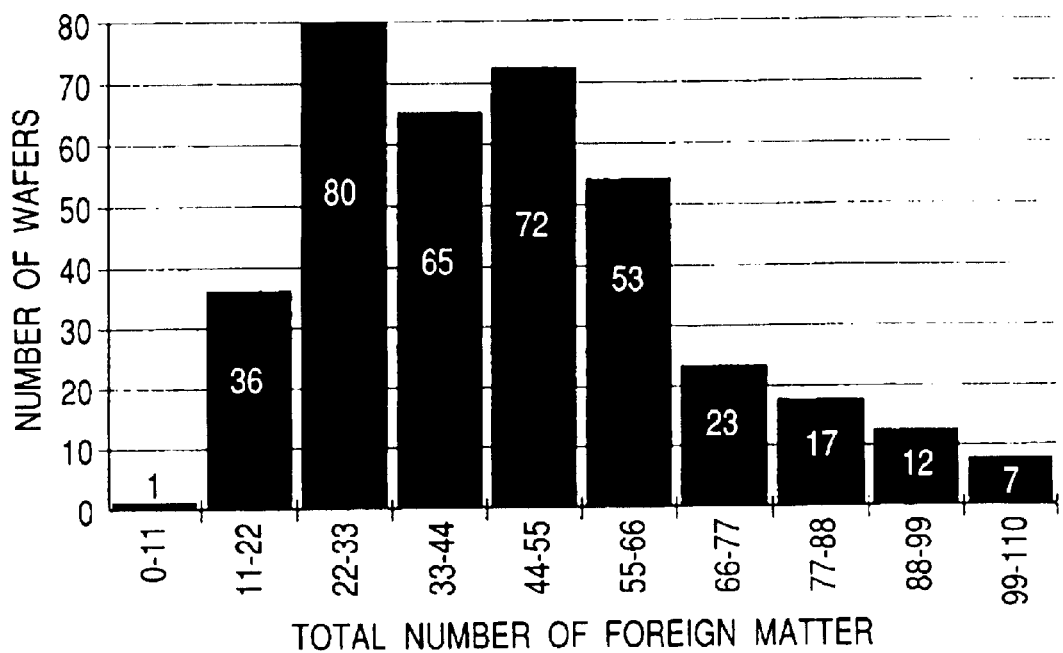
FIG. 15 is a bar graph showing the effect of the embodiment of the present invention.
Figure 16:
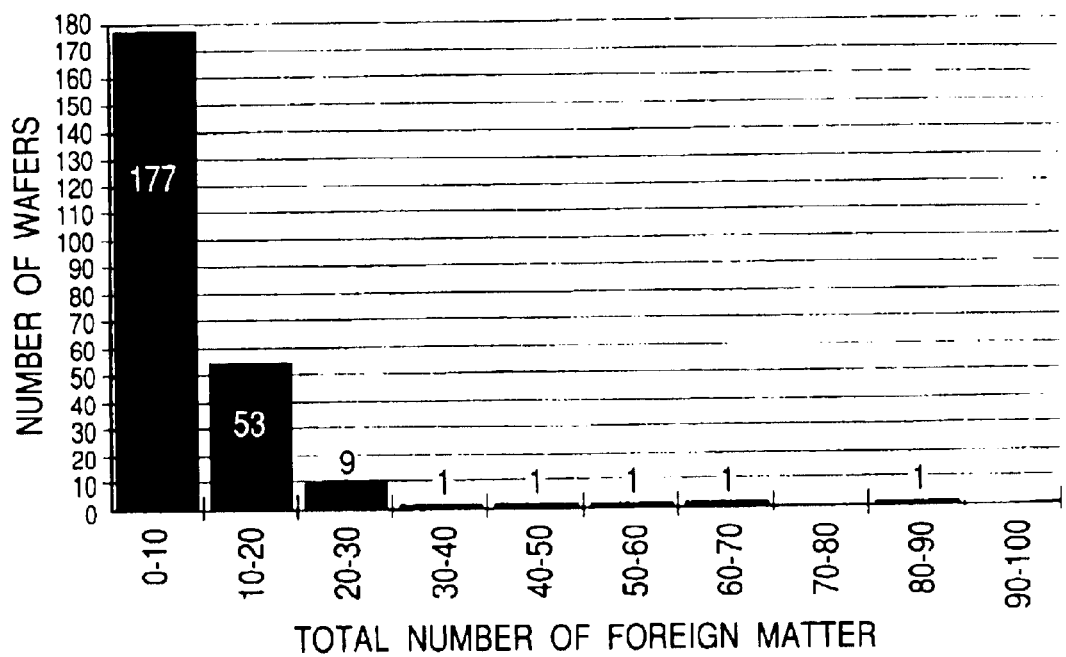
FIG. 16 is a bar graph showing the effect of the embodiment of the present invention.

The amount of foreign matter which remains after the interlayer insulating film is formed for providing insulation between the bit-line BL and the capacitor C is shown in FIG. 15 and FIG. 16. FIG. 15 shows the amount of foreign matter which remains in the case of the interlayer insulating film having a three-layer structure comprising the TEOS film, SOG film, and TEOS film; and, on the other hand, FIG. 16 shows the amount of foreign matter which remains in the case of the interlayer insulating film having a single-layer structure comprising the silicon oxide film only. As shown in FIG. 15 and FIG. 16, the number of wafers containing foreign matter in an amount of "22 to 33" is largest in the case of the three-layer interlayer insulating film, and the number of wafers containing foreign matter in an amount of "44 to 55" is next largest and the numbers for "33 to 44" and "55 to 66" decrease, in this order. Furthermore, the number of wafers containing foreign matter in a range from 22 to 66 occupies approximately 74% of the whole. On the other hand, the number of wafers containing foreign matter in an amount of "0 to 10" is largest in the case of the single-layer interlayer insulating film, and the total number of wafers containing foreign matter in a range from 0 to 20 occupies approximately 96% of the whole. As described hereinabove, the occurrence of foreign matter can be suppressed in accordance with the present invention.

An effect to be described hereinafter is obtained by avoiding the use of SOG. As described hereinafter, a plug 39 which serves for electrical connection between the memory cell selection MISFET Qs and the capacitor C is formed in the interlayer insulating film for providing insulation between the bit-line and the capacitor C. The plug is formed by embedding a conductive film consisting of W in a contact hole formed in the interlayer insulating film.

Figure 17:
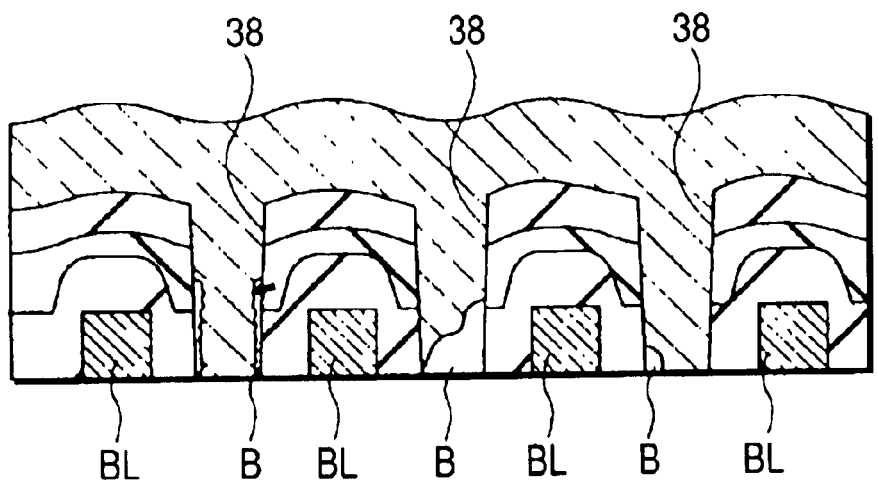
FIG. 17 is a partial cross-sectional view of the substrate of the semiconductor integrated circuit device for describing the effect of the present embodiment of the invention.

However, if the interlayer insulating film has a SOG film, moisture and gas generated from the SOG film remain in the contact hole when the conductive film is embedded, and the conductive film can not be embedded sufficiently. As a result, voids B are formed in the plug, as shown in FIG. 17, to thereby cause a connection failure.

However, in the present embodiment, a structure is employed in which the signal layer (only the HDP silicon oxide film 34) is used between the bit-line BL and the capacitor C, which will be described hereinafter, and in which the top is flattened by means of a CMP technique, to that the above-mentioned connection failure is suppressed.

Now, a process for forming the capacitor C and the plug 39, that serves to electrically interconnect the capacitor C and the memory cell selection MISFET Qs, will be described.

Figure 10:
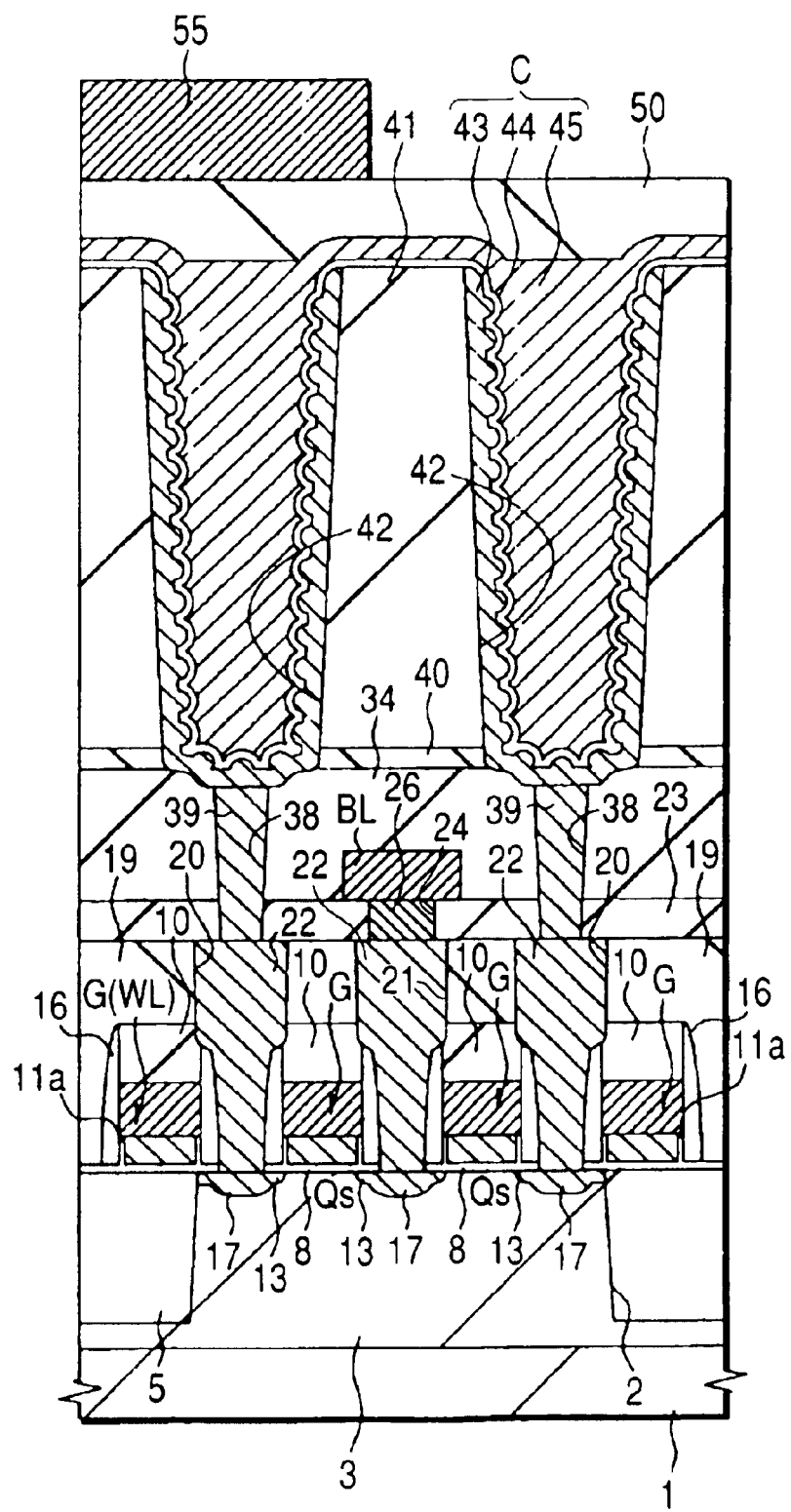
FIG. 10 is a partial cross-sectional view, as seen along the line B—B in FIG. 11, of the substrate showing a step in the method of manufacture of the semiconductor integrated circuit device (DRAM) according to the embodiment 1 of the present invention.
Figure 11:
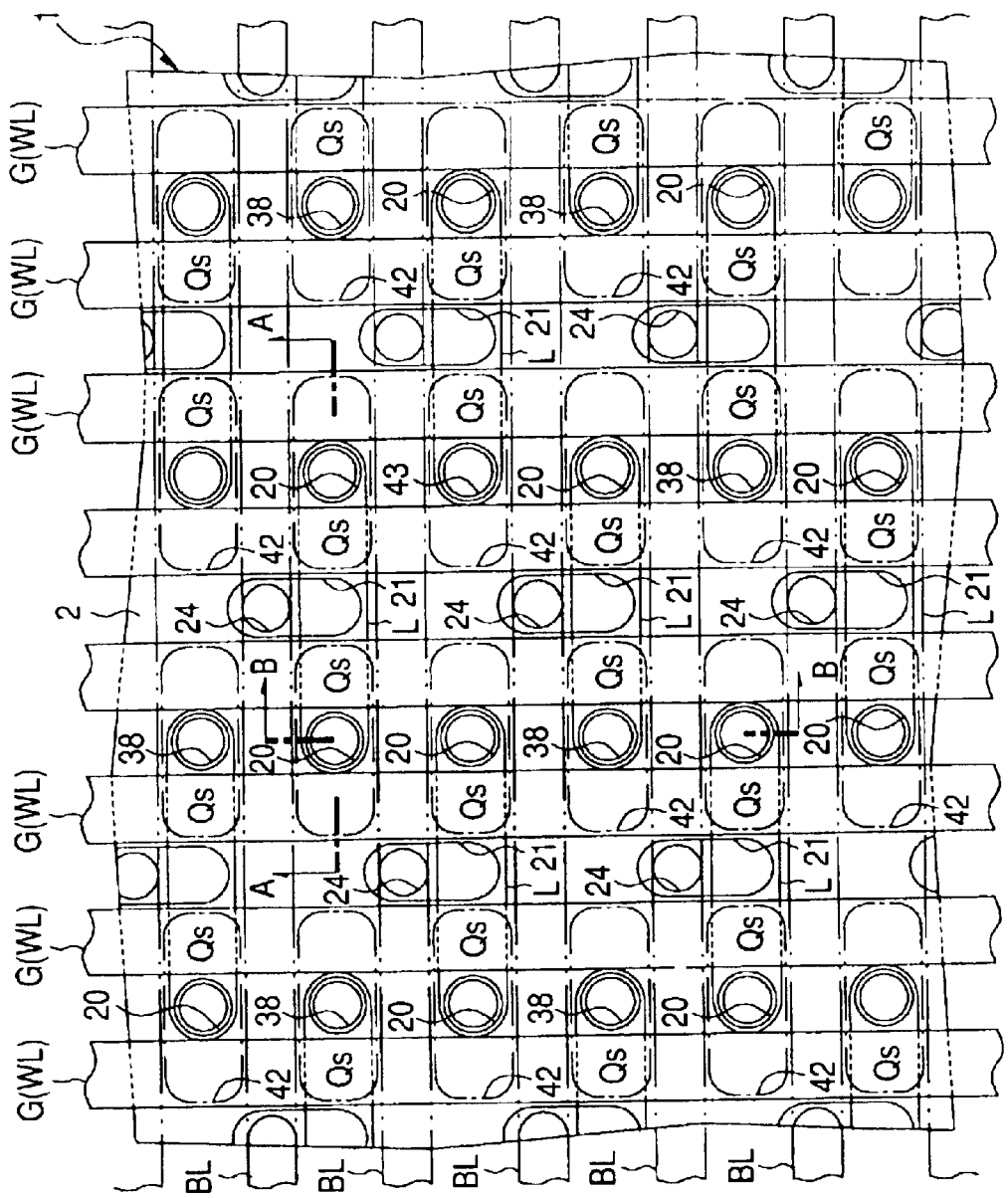
FIG. 11 is a partial plan view of the substrate showing a step in the method of manufacture of the semiconductor integrated circuit device (DRAM) according to the embodiment 1 of the present invention.

At first, as shown in FIG. 9 to FIG. 11, the HDP silicon oxide film 34 and the silicon oxide film 23, that is laminated under the HDP silicon oxide film 34, are subjected to dry etching to form a through hole 38 on the top of the plug 22 that is formed in the contact hole 20. Next, a W film is deposited on the top of the HDP silicon oxide film 34, including the inside of the through hole 38, by means of a CVD technique, and the W film formed on the top of the HDP silicon oxide film 34 is polished by means of a CMP technique so that it remains only inside the through hole, to thereby form the plug 39. FIG. 9 is a cross-sectional view taken along the line A—A of FIG. 11, and FIG. 10 is a cross-sectional view taken along the line B—B of FIG. 11. Herein, according to the present embodiment, because a SOG film, that is apt to generate moisture and gas, is not used in the interlayer insulating film, as described hereinabove, the W film can be deposited accurately inside the through hole 38. As a result, contact failure between the plug 39 and the plug 22, that is located under the plug 39, is suppressed.

Next, the capacitor C is formed. To form the capacitor C, at first, a silicon nitride film 40 is formed on the top of the HDP silicon oxide film 34 by use of a plasma CVD technique, and a silicon oxide film 41 is formed on the top of the silicon nitride film 40 subsequently by means of a CVD technique. Then, the silicon oxide film 41 and the silicon nitride film 40 are subjected to dry etching to form a groove 42 on the top of the through hole 38. The silicon nitride film 40 serves as a stopper when the silicon oxide film 41 is etched. Furthermore, a thick silicon oxide film 41 is formed to increase the surface area of the groove 42, and so that a capacitance insulating film having an increased surface area formed inside the groove 42 can be attained. As a result, the capacitance of the capacitor can be increased.

Next, a low resistance polycrystalline silicon film doped with n-type impurity, such as phosphorus (P), is deposited on the top of the silicon oxide film 41, including the inside of the groove 42, by means of a CVD technique, and a photoresist film is embedded in the groove 42. Then, the polycrystalline silicon film formed on the top of the silicon oxide film 41 is etched back so as to remain only on the inside wall of the groove 42. Thereby, the bottom electrode 43 of the capacitor C is formed along the inside wall of the groove 42.

Next, a tantalum oxide film 44, that is to be used as the capacitance insulating film (dielectric film), is deposited inside the groove 42, on which the bottom electrode 43 has been formed, and on the silicon oxide film 41. The tantalum oxide film 44 is deposited by use of penta-ethoxy tantalum $(Ta(OC_2H_5)_5)$ and oxygen as the raw materials.

Next, to improve the film quality of the tantalum oxide film 44, the tantalum oxide film 44 is subjected to heat treatment (annealing) at a temperature of 700° C. or higher.

The tantalum oxide film 44 is crystallized by heat treatment. Furthermore, any defect in the tantalum oxide film 44 is restored by the heat treatment, and the leakage current is reduced.

As described hereinabove, according to the present embodiment, because RTA (heat treatment) is applied after the HDP silicon oxide film 34 has been formed, and the film stress caused by the bit-line BL and the HDP silicon oxide film 34 is reduced beforehand, the film stress exerted on the bit-line BL is reduced when the tantalum oxide film 44 is annealed to crystallize it, and so breakage and separation of the bit-line BL are suppressed. Herein, in the present embodiment, tantalum oxide is used as the capacitance insulating film, but, for example, a high/strong dielectric material, such as lead titanate zirconate, may be used. Because crystallization annealing is required also for such a film, the same effect is obtained by heat treatment of the HDP silicon oxide film 34.

Next, a TiN film 45, that is to serve as the top electrode 45, is deposited on the tantalum oxide film 44 by means of a CVD technique, so that the inside of the groove 42 is filled.

Thereby, the capacitor C is formed, comprising the bottom electrode 33 formed of a polycrystalline silicon film, the capacitance insulation film 44 formed of the tantalum oxide film, and the top electrode 45 formed of the TiN film. Furthermore, the memory cell of the DRAM, comprising the memory cell selection MISFET Qs and the capacitor C connected in series to the memory cell selection MISFET Qs, is completed through the process described hereinabove. FIG. 11 is a partial plan view of the semiconductor substrate on which the capacitor C has been formed.

Thereafter, a silicon oxide film 50 and a wiring 55, consisting of Al (aluminum), are formed on the top of the capacitor C. Further, a silicon oxide film and wiring are formed, and a surface protection film is formed on the top of the silicon oxide film and the wiring, though these components are omitted in the drawing.

Embodiment 2

An HDP-CVD film (HDP silicon oxide film 34) is used as the interlayer effecting insulating film for insulation between the bit-line BL and the capacitor C in the embodiment 1, however, a TEOS film formed by means of a plasma CVD technique may be used as the interlayer insulating film. Except the process for forming the interlayer insulating film for providing insulation between the bit-line BL and the capacitor C, the processes for forming the bit line BL (FIG. 1 to FIG. 6), the process for forming the plug 39, and the following processes are the same as those applied in the embodiment 1, and, therefore, a repeated description thereof will be omitted.

Figure 18:
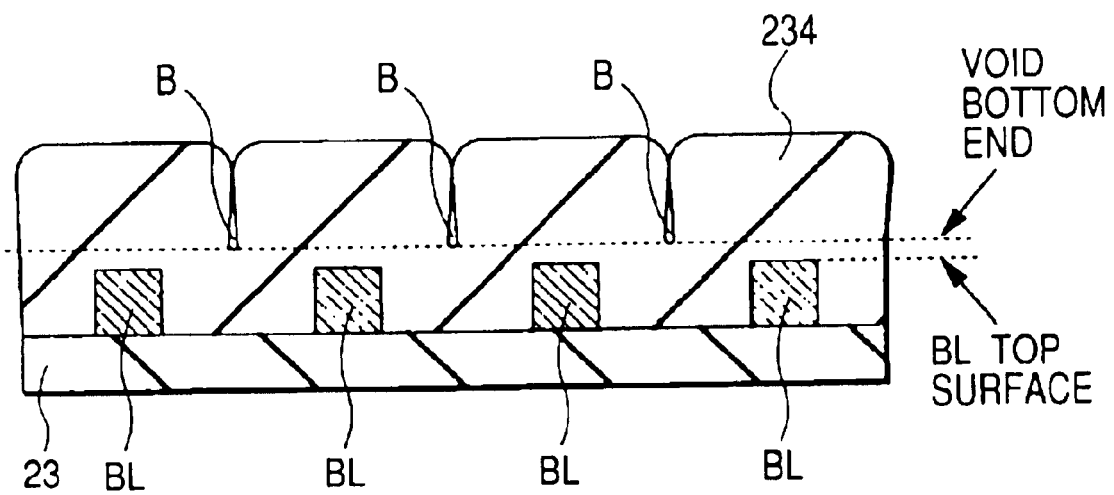
FIG. 18 is a partial cross-sectional view, as seen along line B—B in FIG. 11, of the substrate of the semiconductor integrated circuit device according to an embodiment 2 of the present invention.

At first, a semiconductor substrate is provided, on which the bit-line BL have been formed, and a TEOS film 234 is deposited on the top of the bit lines BL and on a silicon oxide film 23 disposed under the bit-lines BL, as shown in FIG. 18. FIG. 18 is a partial cross-sectional view of the semiconductor substrate showing a step in the process of manufacture of a DRAM of the present embodiment. For example, FIG. 18 corresponds to the cross-section taken along line B—B of FIG. 11. In FIG. 18, layers located under the silicon oxide film 23 (for example, plug 22 and element separation 2) are omitted (as well as in FIG. 19 and FIG. 20 to be described hereinafter).

The TEOS film 234 is formed by means of a plasma CVD technique by use of tetraethoxy-silane and ozone (O3) as the raw materials, as described hereinbefore. At that time, the film forming temperature (first temperature) is equal to or lower than 450° C., and for example, in the case of the TEOS film 234, a film forming temperature of 400° C. is employed.

Next, the semiconductor substrate 1 is subjected to RTA (Rapid Thermal Anneal, heat treatment) at 750° C. for 60 seconds or shorter. RTA involves irradiation of light emitted from a tungsten-halogen lamp onto the semiconductor substrate 1 (wafer), so that the semiconductor substrate 1 is heated by the radiation heat.

Next, the surface of the TEOS film 234 is polished by means of a CMP technique to flatten the surface. It is desirable to polish the TEOS film 234 at least down to the region located under the voids B, which are generated in the TEOS film 234 while it is being formed, as shown in FIG. 18. If a void remains, slurry used in the CMP remains as foreign matter, and this tends to cause the surface of the TEOS film 234 to be uneven. As a result of such unevenness, the focus precision becomes poor when a contact hole formed in the TEOS film 234 and the pattern to be located on the TEOS film 234 are subjected to photolithography.

The above-mentioned heat treatment may be carried out after polishing. The TEOS film 234 serves as the interlayer insulating film for providing insulation between the bit-line BL and the capacitor C, which will be described hereinafter.

As described hereinabove, according to the present embodiment, because the heat treatment is carried out after the TEOS film 234 has been formed, as in the case of the embodiment 1, the film stress caused by the TEOS film 234 is reduced beforehand. Therefore, even though high temperature heat treatment, for example, crystallization annealing of the capacitance insulating film (tantalum oxide film) of the capacitor C, is carried out in the following process, the film stress exerted on the bit-line BL is reduced, and breakage and separation of the bit-line BL are suppressed. Though RTA is carried out at 750° C. in the present embodiment, the effect is obtained by employing an RTA temperature equal to or higher than the film forming temperature of the TEOS film 234. Furthermore, by employing an RTA temperature equal to or higher than the crystallization annealing temperature, a stress that is the same as the stress exerted on the bit-lines BL and TEOS film 234 during annealing is relaxed.

Furthermore, because a single layer (only the TEOS film 234) is interposed between the bit-line BL and the capacitor C, and since the surface is flattened by means of a CMP technique in the present embodiment, generation of foreign matter is suppressed, as in the case of the embodiment 1. In addition, because a single layer (only TEOS film 234) is interposed between the bit-line BL and the capacitor C, which will be described hereinafter, and an SOG film that is apt to generate moisture and gas is not used, a W film can be deposited inside the through hole 38 precisely, and contact failure between the plug 39 and the plug 22 located under the plug 39 can be suppressed, as a result.

Subsequently, the capacitor C and the plug 39 for electrical connection between the capacitor C and the memory cell selection MISFET Qs are formed. However, description of this forming process will be omitted because the forming process is the same as that carried out in the embodiment 1, as described with reference to FIG. 9 to FIG. 11.

Embodiment 3

Although an HDP-CVD film (HDP silicon oxide film 34) is used as the interlayer insulating film for insulation between the bit-line BL and the capacitor C in the embodiment 1, instead, a laminate film comprising an HDP silicon oxide film and a TEOS film may be used as the interlayer insulating film. Except for the process for forming the interlayer insulating film for providing insulation between the bit-line BL and the capacitor C, the process for forming the bit line BL (FIG. 1 to FIG. 6), the process for forming the plug 39, and the following processes are the same as those employed in the embodiment 1, and, therefore, a repeated description thereof will be omitted.

Figure 19:
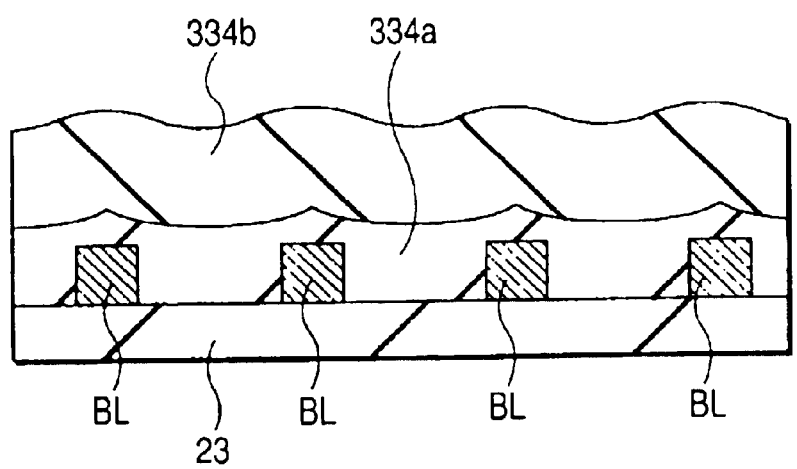
FIG. 19 is a partial cross-sectional view, as seen along line B—B in FIG. 11, of the substrate of the semiconductor integrated circuit device according to the embodiment 3 of the present invention.

At first, a semiconductor substrate is provided, on which a bit-line BL has been formed, and an HDP silicon oxide film 334a is deposited on the top of the bit lines BL and on a silicon oxide film 23 disposed under the bit-lines BL by means of a HDP-CVD technique, as shown in FIG. 19, as in the case of the embodiment 1. Silicon oxide can be embedded deeply inside of the groove, even though the groove is small and narrow (narrow space), by means of a HDP-CVD technique. Herein, the film forming temperature applied for film forming is equal to or lower than 450° C. (first temperature). Next, a TEOS film 334b is formed on the HDP silicon oxide film 334a by means of a CVD technique by use of ozone ($O_3$) and tetraethoxy-silane as the raw materials. At that time, the film forming temperature is equal to or lower than 450° C., and, for example, the film forming temperature is 400° C. in the case of this TEOS film 334b.

Next, the semiconductor substrate 1 is subjected to RTA at 750° C. (second temperature) for 60 seconds or shorter. RTA involves irradiation of light emitted from a tungsten-halogen lamp onto the semiconductor substrate 1 (wafer), and the semiconductor substrate 1 is heated by the radiation heat.

Next, the top of the TEOS film 334b is polished by means of a CMP technique to flatten the surface. Instead, the above-mentioned RTA may be carried out after the polishing. A laminate film comprising the silicon oxide film 334a and the TEOS film 334b serves as the interlayer insulating film for providing insulation between the bit-line BL and the capacitor C, which will be described hereinafter.

As described hereinabove, according to the present embodiment, because the silicon oxide film 334a is formed by means of an HDP-CVD technique, and the TEOS film 334b is formed on the silicon oxide film 334a, the thickness of the silicon oxide film is secured, and the polishing precision can be improved.

Furthermore, as in the case of the embodiment 1, because RTA (heat treatment) is carried out after the silicon oxide film 334a and the TEOS film 334b have been formed, the film stress caused from these films is reduced beforehand. Therefore, even though high temperature heat treatment, for example, crystallization annealing of the capacitance insulating film (tantalum oxide film) of the capacitor C is carried out in the following process, the film stress exerted on the bit-line BL is reduced, and breakage and separation of the bit-line BL are suppressed. Though RTA is carried out at 750° C. in the present embodiment, the effect is obtained by employing an RTA temperature equal to or higher than the film forming temperature of the HDP silicon oxide film 334a and TEOS film 334b. Furthermore, by employing an RTA temperature equal to or higher than the crystallization annealing temperature, a stress that is the same as the stress exerted on the bit-line BL, the HDP silicon oxide film 334a and the TEOS film 334b during annealing is relaxed.

Furthermore, because an SOG film that is apt to generate moisture and gas is not used between the bit-line BL and the capacitor C, which will be described hereinafter, a W film can be deposited inside the through hole 38 precisely, and contact failure between the plug 39 and the plug 22 located under the plug 39 can be suppressed, as a result.

Subsequently, the capacitor C and the plug 39, provided for electrical connection between the capacitor C and the memory cell selection MISFET Qs, are formed. However, a description of this forming process will be omitted because the forming process is the same as that carried out in the embodiment 1, as described with reference to FIG. 9 to FIG. 11.

Embodiment 4

Although a laminate film, comprising the HDP-CVD film and TEOS film, is used as the interlayer insulating film for providing insulation between the bit-line BL and the capacitor C in the embodiment 1, a three-layer structure, comprising a TEOS film, an SOG film (coating film) and a TEOS film, may be used as the interlayer insulating film. Except the process for forming the interlayer insulating film for insulation between the bit-line BL and the capacitor C, the process for forming the bit line BL (FIG. 1 to FIG. 6), the process for forming the plug 39 and the following process (FIG. 9 to FIG. 11) are the same as those applied in the embodiment 1, and, therefore, a repeated description thereof will be omitted.

Figure 20:
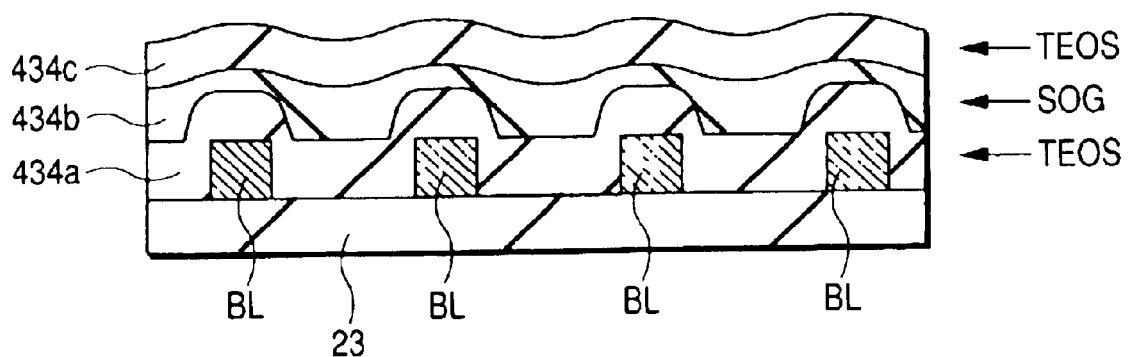
FIG. 20 is a partial cross-sectional view, as seen along line B—B in FIG. 11, of the substrate of the semiconductor integrated circuit device according to the embodiment 4 of the present invention.

At first, a semiconductor substrate is provided, on which bit-lines BL have been formed, and a TEOS film 434a is deposited on the top of the bit lines BL and on a silicon oxide film 23 disposed under the bit-lines BL, as shown in FIG. 20, by means of a CVD technique using ozone (O3) and tetraethoxy-silane as raw materials. At that time, the film forming temperature (first temperature) is equal to or lower then 450° C., and, for example, in the case of the TEOS film 434a, a film forming temperature of 400° C. is employed. Next, an SOG film 434b is coated on the TEOS film 434a.

Next, the semiconductor substrate 1 is subjected to RTA (Rapid Thermal Anneal, heat treatment) at 750° C. (second temperature) for 60 seconds or shorter. RTA involves irradiation of light emitted from a tungsten-halogen lamp onto the semiconductor substrate 1 (wafer), and the semiconductor substrate 1 is heated by the radiation heat.

Next, the TEOS film 434c is deposited in the same manner as used for depositing the TEOS film 434a on the SOG film 434b. Instead, the above-mentioned RTA may be carried out after the TEOS film 434c has been formed. The laminate film comprising the TEOS film, SOG film and TEOS film, serves as the interlayer insulating film for providing insulation between the bit-line BL and the capacitor C, which will be described hereinafter.

As described hereinabove, according to the present embodiment, because a laminate film, comprising the TEOS film, SOG film and TEOS film, which are used generally, is used as the interlayer insulating film, an interlayer insulating film can be formed easily at a low cost.

Furthermore, because heat treatment is carried out at a temperature equal to or higher than 750° C., namely the crystallization annealing temperature of the capacitance insulating film (tantalum oxide film) of the capacitor C, after the laminate film has been formed, the film stress caused from these films is reduced beforehand, and the film stress exerted on the bit-line BL during crystallization annealing is reduced. As a result, breakage and separation of the bit-lines BL are suppressed. RTA is carried out at 750° C. in the present embodiment, but the annealing temperature is by no means limited to 750° C., and by employing an RTA temperature equal to or higher than the crystallization annealing temperature, the stress that is the same as the stress exerted on the bit-line BL, the SOG film, and TEOS film during annealing is relaxed.

Subsequently, the capacitor C and the plug 39 for electrical connection between the capacitor C and the memory cell selection MISFET Qs are formed. However, a description of this forming process will be omitted because the forming process is the same as that carried out in the embodiment 1, as described with reference to FIG. 9 to FIG. 11.

Embodiment 5

A method of manufacture of a semiconductor integrated circuit device will be described hereinafter with reference to FIG. 21 to FIG. 26, in the order of the steps thereof.

Figure 21:
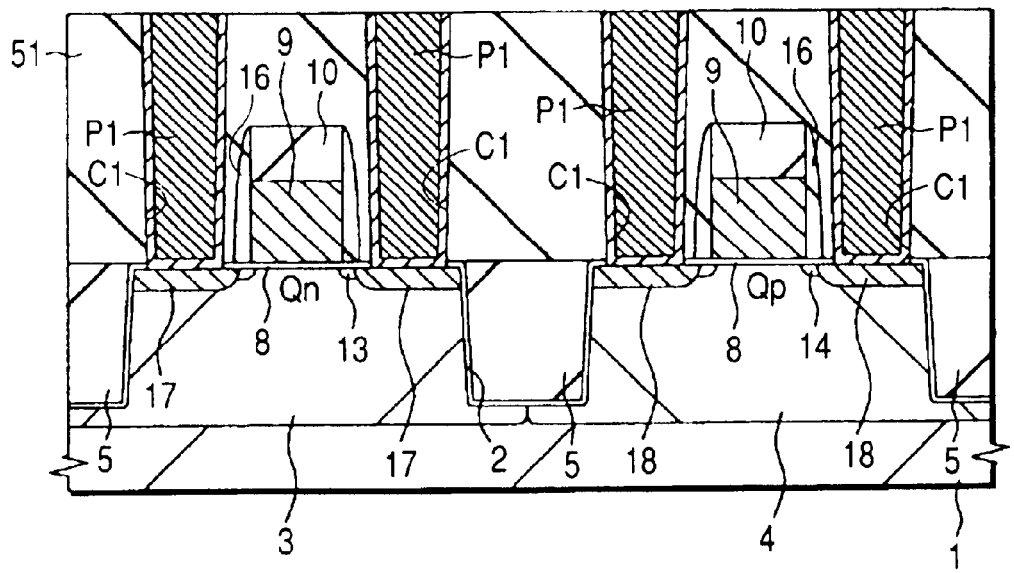
FIG. 21 is a partial cross-sectional view of substrate showing a step in the method of manufacture of the semiconductor integrated circuit device according to the embodiment 5 of the present invention.

At first, a semiconductor element is formed on the main surface of a semiconductor substrate 1. FIG. 21 shows an exemplary case in which an n-channel type MISFET Qn and a p-channel type MISFET Qp are formed as the semiconductor element. The MISFET Qn and MISFET Qp are formed according to the usual MISFET forming process.

A typical example of a MISFET forming process will be described hereinafter.

At first, an element separation 2 is formed on the semiconductor substrate 1, consisting of p-type single crystalline silicon, in the same manner as used in the embodiment 1.

Next, p-type impurity and n-type impurity are ion-implanted into the substrate 1, and the substrate 1 is heat treated to diffuse the impurity, to thereby form p-type well 3 and n-type well 4.

Thereafter, a gate oxide film 8 is formed on the surface of the respective p-type well 3 and n-type well 4 by means of thermal oxidation. Next, a low resistance polycrystalline silicon film 9, that has been doped with phosphorus, is deposited on the top of the gate oxide film 8 by means of a CVD technique, and, subsequently, a silicon nitride film 10 is deposited on the top of the low resistance polycrystalline silicon film 9 by means of a CVD technique.

Next, the silicon nitride film 10 is subjected to dry etching, so that the silicon nitride film 10 remains on the region where a gate electrode is to be formed. Then, the polycrystalline silicon film 9 is subjected to dry etching, using the silicon nitride film 10 as a mask, to form a gate electrode 9.

Next, n-type impurity is ion-implanted into the p-type well 3 located on both sides of the gate electrode 9 to thereby form a n-type semiconductor region 13, and p-type impurity is ion-implanted into the n-type well 4 to thereby form a p-type semiconductor region 14.

Next, a silicon nitride film is deposited on the substrate 1 by means of a CVD technique, and the silicon nitride film is etched anisotropically to thereby form a side wall film 16 on the side wall of the gate electrode 9.

Next, n-type impurity is ion-implanted into the p-type well 3 to thereby form an n$^+$-type semiconductor region 17 (source, drain), and p-type impurity is ion-implanted into the n-type well 4 to thereby form a p$^+$-type semiconductor region 18 (source, drain).

By applying the process described above, the n-channel type MISFET Qn and p-channel type MISFET Qp, having an LDD (Lightly Doped Drain)-structured source and drain are formed.

Next, a silicon oxide film 51 is deposited on the MISFET Qn and MISFET Qp by means of a CVD technique, and then the top of the silicon oxide film 51 is polished to flatten the surface.

Next, a photoresist film (not shown in the drawing) is formed on the silicon oxide film 51, and the silicon oxide film 51 is etched using the photoresist film as a mask, to thereby form a contact hole C1 on the n$^+$-type semiconductor region 17 and the p$^+$-type semiconductor region 18 located on the main surface of the semiconductor substrate 1.

Next, a thin TiN film is formed on the silicon oxide film 51, including the inside of the contact hole C1, by means of a CVD technique, and then a W film is deposited by means of a CVD technique. Then, the TiN film and W film deposited outside the contact hole C1 are polished by using a CMP technique, so that these films remain only inside the contact hole C1, to thereby form a plug P1.

Figure 22:
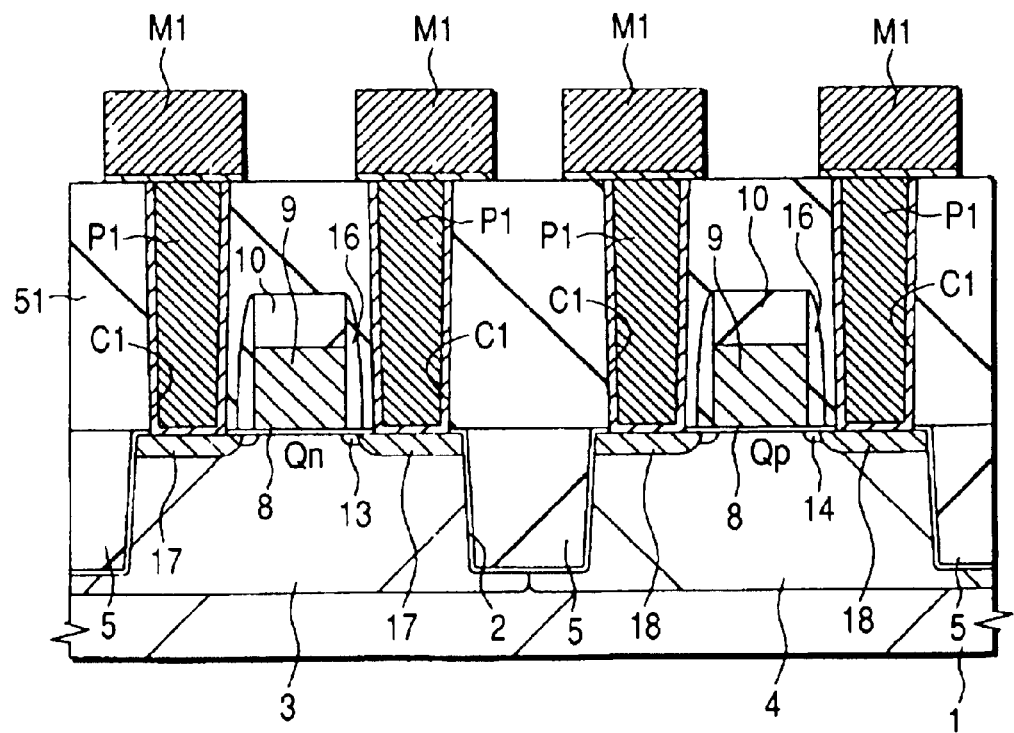
FIG. 22 is a partial cross-sectional view of the substrate showing a step in the method of manufacture of the semiconductor integrated circuit device according to the embodiment 5 of the present invention.

Next, as shown in FIG. 22, a TiN film and a W film are deposited successively on the silicon oxide film 51 and the plugs P1, and these films are patterned to have a desired configuration, to thereby form a first layer wiring M1.

Figure 23:
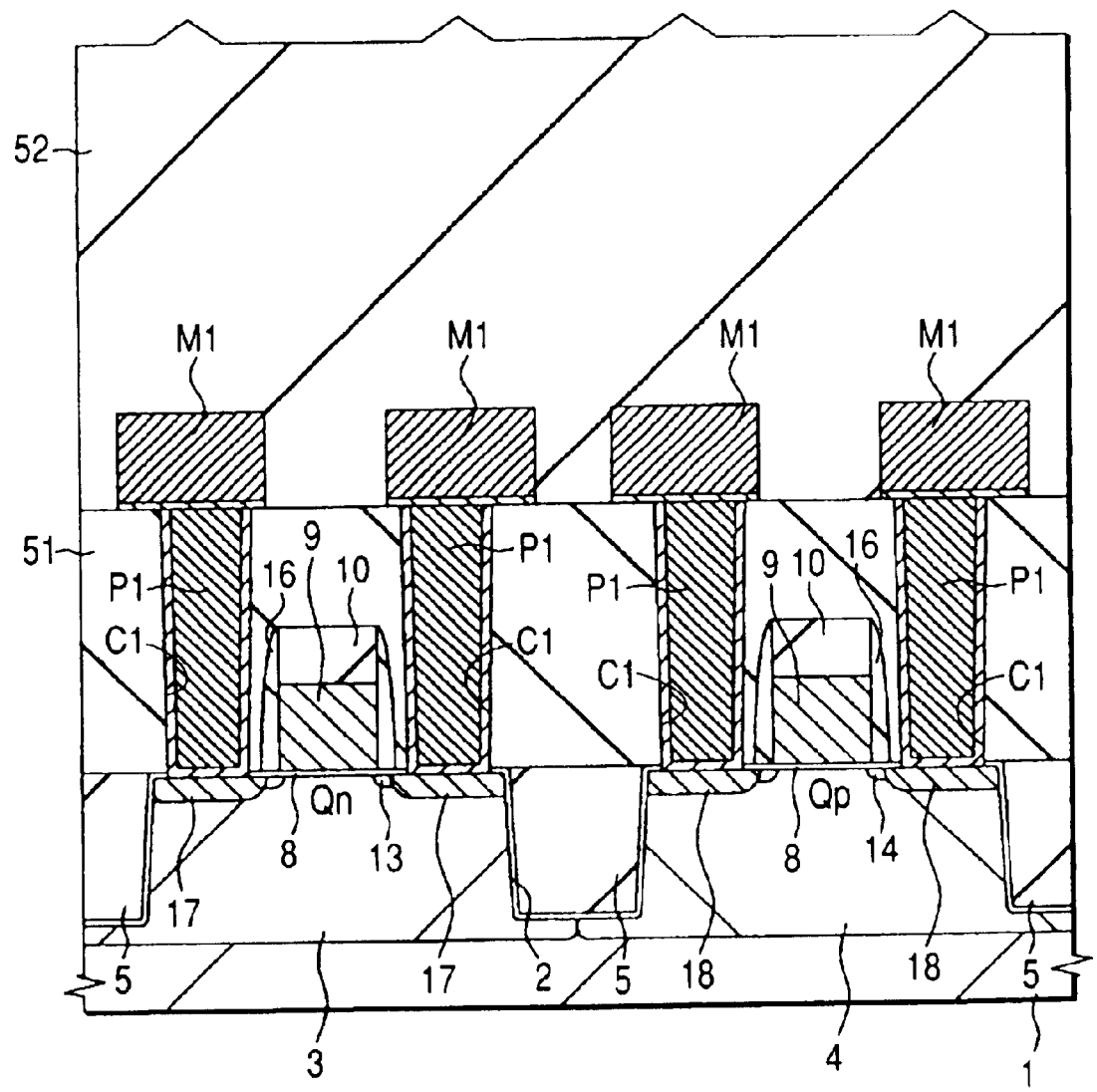
FIG. 23 is a partial cross-sectional view of the substrate showing a step in the method of manufacture of the semiconductor integrated circuit device according to the embodiment 5 of the present invention.

Next, as shown in FIG. 23, a silicon oxide film 52 is deposited on the first layer wiring M1 and silicon oxide film 51. The silicon oxide film 52 is formed by means of a high density plasma CVD technique. By employing a high density plasma CVD technique, silicon oxide is filled deeply inside of the grooves even though the groove width is narrow and small (small space), as described with reference to embodiment 1. At that time, the film forming temperature is equal to 700° C. or lower, and, for example, a temperature in a range from 350° C. to 650° C. is applied in the case of the silicone oxide film 52.

Next, the semiconductor substrate 1 is subjected to RTA (Rapid Thermal Anneal, lamp anneal, heat treatment) at 750° C. (second temperature) for 60 seconds or shorter. RTA involves irradiation of light emitted from a tungsten-halogen lamp onto the semiconductor substrate 1 (wafer), and the semiconductor substrate 1 is heated by the radiation heat.

Figure 24:
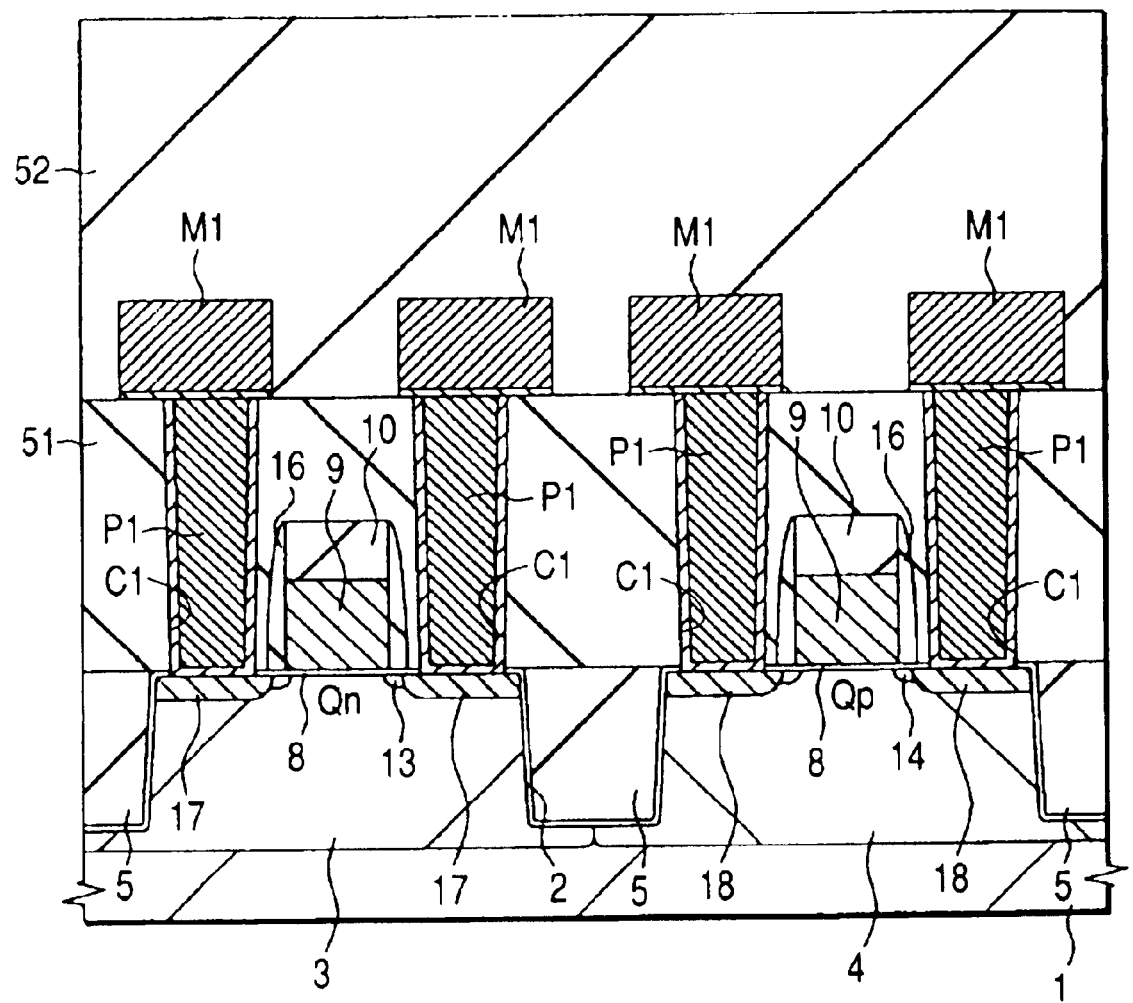
FIG. 24 is a partial cross-sectional view of the substrate showing a step in the method of manufacture of the semiconductor integrated circuit device according to the embodiment 5 of the present invention.

Next, as shown in FIG. 24, the top of the silicon oxide film 52 is polished by means of a CMP technique to flatten the surface.

As described hereinabove, according to the present embodiment, because heat treatment is carried out after the silicon oxide film 52 has been formed, the film stress caused by the silicon oxide film 52 is reduced beforehand. Therefore, even though high temperature heat treatment, for example, high temperature treatment applied when the TiN (titanium nitride) film that constitutes the plug P2 is deposited by means of a CVD technique, the film stress exerted on the wiring M1 is reduced, and breakage and separation of the bit-lines BL are suppressed.

Figure 25:
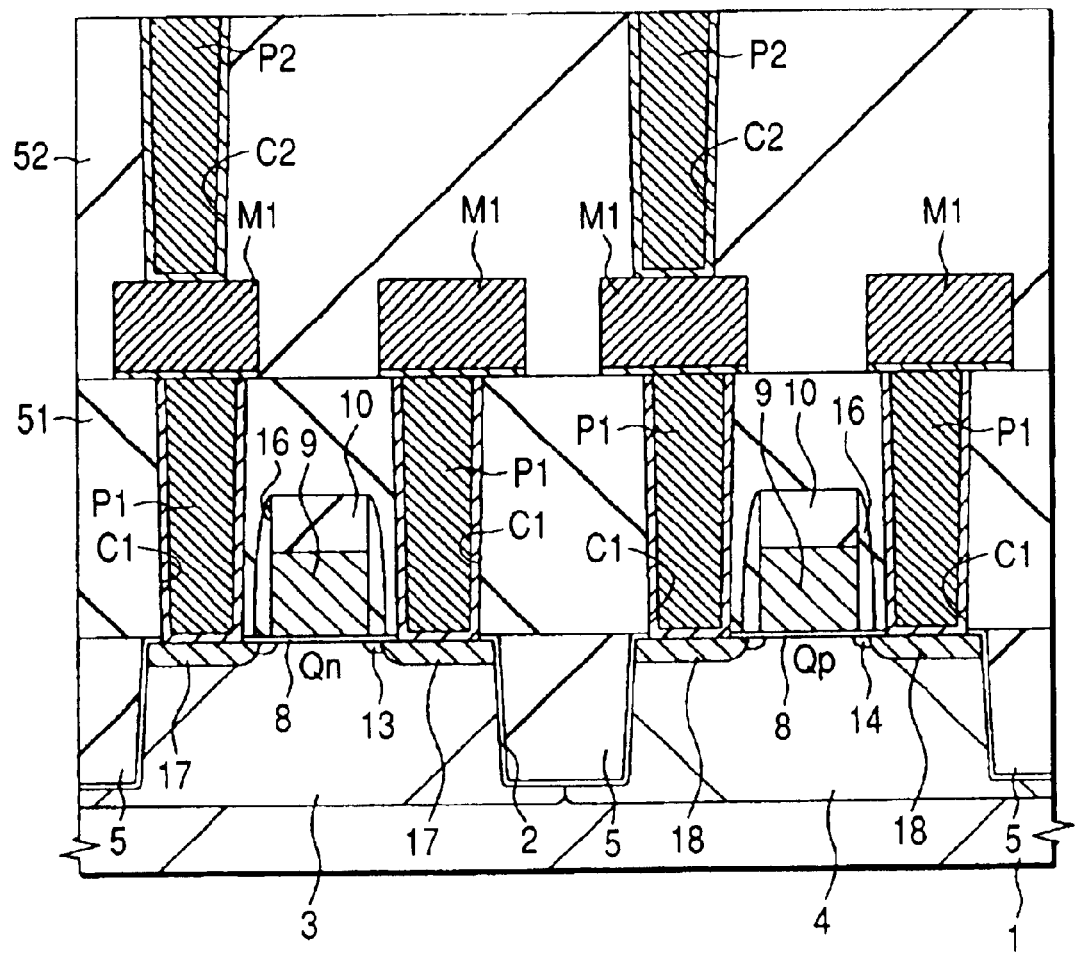
FIG. 25 is a partial cross-sectional view of the substrate showing a step in the method of manufacture of the semiconductor integrated circuit device according to the embodiment 5 of the present invention.

Thereafter, as shown in FIG. 25, a photoresist film (not shown in the drawing) is formed on the silicon oxide film (insulating film) 52, and the silicon oxide film 52 is etched using the photoresist film as a mask, to thereby form a contact hole C2 on the first layer wiring M1.

Next, a thin TiN film (conductive layer) is formed on the silicon oxide film 52, including the inside of the contact hole C2, by means of a CVD technique, and then a W film (conductive layer) is deposited by means of a CVD technique. Thereafter, the TiN film and W film deposited outside the contact hole C2 are polished by means of a CMP technique, so that these films remain only inside the contact hole C2, to thereby form a plug P2. This TiN (titanium nitride) film functions as a barrier metal film and is deposited at a temperature in a range of approximately 600 to 650° C. In this embodiment, the TiN film is formed at 630° C.

As described hereinabove, according to the present embodiment, because heat treatment is carried out after the silicon oxide film 52 has been formed, and the film stress caused by the wiring M1 and the silicon oxide film 52 is reduced beforehand, the film stress exerted on the wiring M1 is reduced, and breakage and separation of the wiring M1 are suppressed. RTA is carried out at 750° C. in the present embodiment, but by employing an RTA temperature equal to or higher than the film forming temperature of the silicon oxide film 52, the effect is obtained initially. Furthermore, by employing an RTA temperature equal to or higher than the film forming temperature of the TiN film, stress that is the same as the stress exerted on the bit-line BL and silicon oxide film 52 in the process is relaxed.

Figure 26:
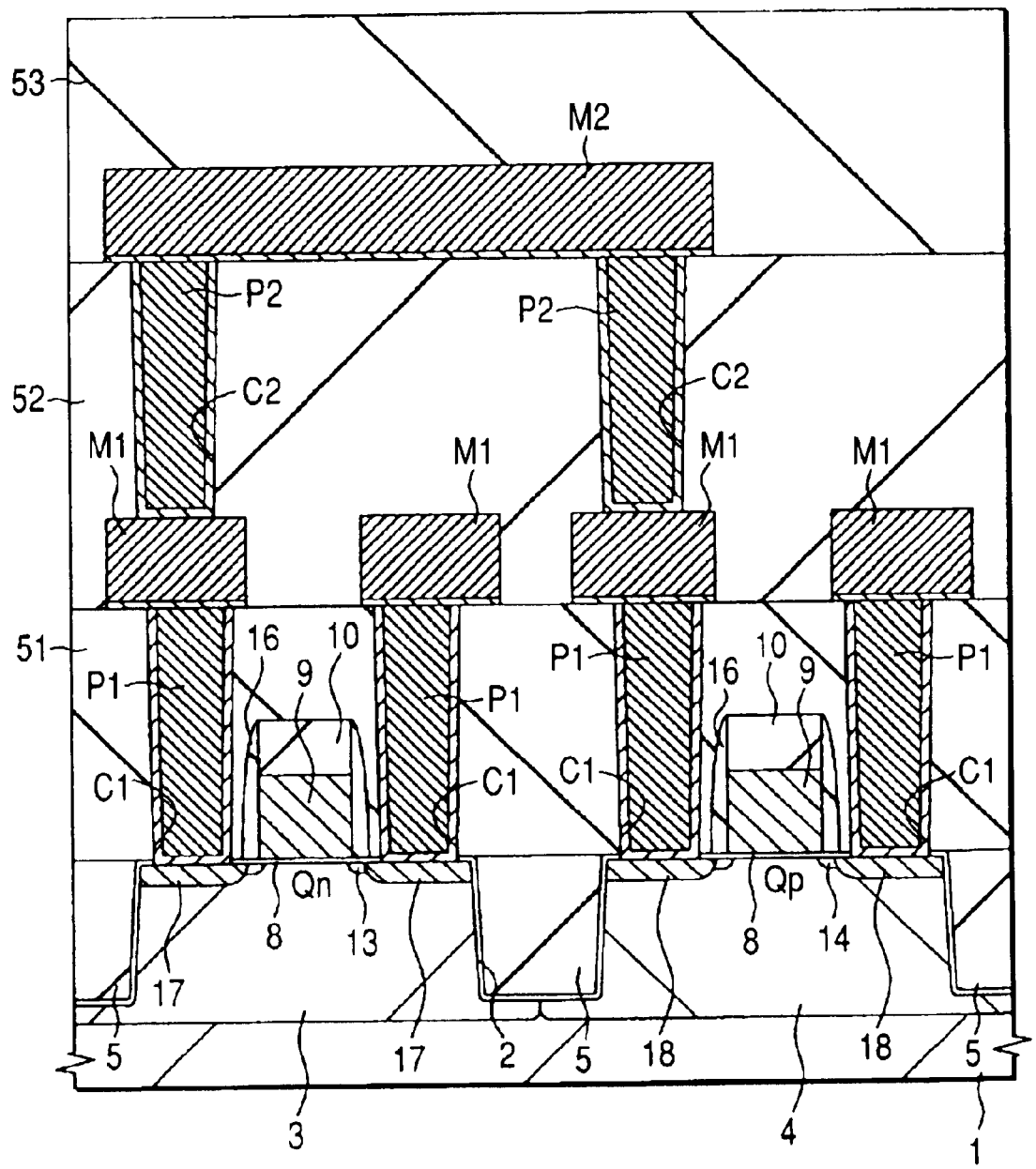
FIG. 26 is a partial cross-sectional view of the substrate showing a step in the method of manufacture of the semiconductor integrated circuit device according to the embodiment 5 of the present invention.

Next, as shown in FIG. 26, a TiN film and a W film are deposited successively on the silicon oxide film 52 and plug P2, and these films are patterned in a desired configuration to thereby form the second layer wiring (conductive layer) M2. The second layer wiring M2 comprises a TiN film and a W film in the present embodiment, but Al (Aluminum) or Cu (Copper) may be used instead. Next, a silicon oxide film 53 is deposited on the second layer wiring M2 and silicon oxide film 52.

By repeating the processes of forming a plug, the wiring, and an interlayer insulating film (silicon oxide film), a wiring of three layers or more can be produced, and so a description of the following process is omitted.

Furthermore, although RTA (heat treatment) is applied to the silicon oxide film 52 in the present embodiment, in the alternative, heat treatment may be applied to the silicon oxide films 51 and 53 or the insulating film located above the third layer wiring (not shown in the drawing).

The invention accomplished by the inventors of the present invention has been described hereinbefore in detail based on various embodiments; however, the present invention is by no means limited to the above-mentioned embodiments, and various modifications may be applied without departing from the spirit and the scope of the invention.

Particularly, in the above-mentioned embodiments, the present invention is applied to the insulating film formed on a bit-line of a DRAM or the insulating film formed on wiring; however, the present invention may be applied widely to any insulating film formed on a conductive layer that is subjected to heat treatment after forming.

The effects obtained by applying representative features and aspects of the present invention disclosed in the present application will be described hereinafter.

(1) A second insulating film is formed at a first temperature so as to cover a wiring and then a second insulating film is subjected to heat treatment at a second temperature that is higher than the above-mentioned first temperature; and, furthermore, a first electrode, a dielectric film, and a second electrode are formed on the above-mentioned second insulating film. As a result, the film stress exerted on the wiring is reduced, and breakage and separation of the wiring are prevented when the dielectric film is subjected to the heat treatment process.

(2) Because the second insulating film is formed so as to cover the wiring and the second insulating film is subjected to heat treatment at the first temperature, when the second insulating film is etched to form an aperture in the second insulating film and the first conductive layer is formed inside the above-mentioned aperture at the second temperature by means of a chemical vapor deposition technique, the film stress exerted on the wiring is reduced and breakage and separation of the wiring are prevented.

As a result of the above, the performance of a semiconductor integrated circuit device having the above-mentioned wiring is improved.

What is claimed is:
1. A method of manufacture of a semiconductor integrated circuit device, comprising the steps of:
    (a) forming a first insulating film over a semiconductor substrate;
    (b) forming a wiring on the first insulating film;
    (c) forming a second insulating film by a high density plasma deposition at a first temperature so as to cover the wiring,
    (d) heat-treating the second insulating film at a second temperature; and
    (e) forming a capacitor by forming a first electrode a capacitor dielectric film, and a second electrode on the second insulating film and annealing said capacitor dielectric film at a third temperature;
    wherein said second temperature is higher than said first temperature and than said third temperature.

2. The method of manufacture of a semiconductor integrated circuit device according to claim 1, wherein the second insulating film is formed by means of a chemical vapor deposition technique in which the high density plasma is used.

3. The method of manufacture of a semiconductor integrated circuit device according to claim 1, wherein said first insulating film is polished between the step (a) and the step (b).

4. The method of manufacture of a semiconductor integrated circuit device according to claim 1, wherein said second insulating film is polished between the step (c) and the step (d).

5. The method of manufacture of a semiconductor integrated circuit device according to claim 4, wherein the heat treatment of the second insulating film is carried out before the second insulating film is polished.

6. The method of manufacture of a semiconductor integrated circuit device according to claim 1, further comprising the steps of, before the step (a);
    (f) forming a plurality of conductive pieces on the semiconductor substrate with interposition of a third insulating film; and
    (g) forming a pair of semiconductor regions on the semiconductor substrate surface on both ends of a conductive piece,
    wherein the wiring is connected to one of the paired semiconductor regions and the first electrode is connected to the other of the paired semiconductor regions.

7. The method of manufacture of a semiconductor integrated circuit device according to claim 1, wherein the wiring is formed of tungsten.

8. The method for manufacturing a semiconductor integrated circuit device according to claim 1, wherein a lamp annealing technique is employed for the heat treatment.

9. The method of manufacture of a semiconductor integrated circuit device according to claim 8, wherein, during the heat treatment the temperature reaches said second temperature through a first stage, in which the temperature rising speed is fast, and a second stage, in which the temperature rising speed is slower than the temperature rising speed in the first stage.

10. The method of manufacture of a semiconductor integrated circuit device according to claim 1, wherein the capacitor dielectric film is a tantalum oxide film.

11. The method of manufacture of a semiconductor integrated circuit device according to claim 1, wherein the capacitor dielectric film is a lead titanate zirconate film.

12. The method of manufacture of a semiconductor integrated circuit device according to claim 1, wherein said wiring line is a bit line of the semiconductor integrated circuit device.

13. The method of manufacture of a semiconductor device according to claim 12, wherein said bit line has a width of at most 0.12 µm.

14. The method of manufacture of a semiconductor integrated circuit device according to claim 1, wherein said second insulating film is a single layer, and is the only layer between the wiring and the first electrode of the capacitor.

15. The method of manufacture of a semiconductor integrated circuit device according to claim 14, wherein said second insulating film is a silicon oxide film formed using a high density plasma.

16. The method of manufacture of a semiconductor integrated circuit device according to claim 14, wherein said second insulating film is polished between the step (c) and the step (d).

17. The method of manufacturing of a semiconductor integrated circuit device according to claim 16, wherein the second insulating film is polished by a chemical mechanical polishing technique, so as to flatten the top of the second insulating film.

* * * * *